US012757368B2

(12) United States Patent
Kim et al.

(10) Patent No.: US 12,757,368 B2
(45) Date of Patent: Oct. 6, 2026

(54) SEMICONDUCTOR DEVICE HAVING AN ASYMMETRIC FIN-TYPE PATTERNS FORMED BETWEEN TWO SYMMETRIC FIN-TYPE PATTERNS WITH VARYING WIDTH ALONG CENTER VERTICAL LINE OF THE FINS

(71) Applicant: SAMSUNG ELECTRONICS CO., LTD., Suwon-si (KR)

(72) Inventors: Ki-Il Kim, Suwon-si (KR); Jung-gun You, Ansan-si (KR); Gi-gwan Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 121 days.

(21) Appl. No.: 18/604,195

(22) Filed: Mar. 13, 2024

(65) Prior Publication Data

US 2024/0224487 A1 Jul. 4, 2024

Related U.S. Application Data

(63) Continuation of application No. 16/751,460, filed on Jan. 24, 2020, now Pat. No. 11,956,937, which is a
(Continued)

(30) Foreign Application Priority Data

Nov. 2, 2015 (KR) ........................ 10-2015-0152968

(51) Int. Cl.
*H10D 30/62* (2025.01)
*H10B 10/00* (2023.01)
(Continued)

(52) U.S. Cl.
CPC ......... *H10B 10/12* (2023.02); *H10D 30/6211* (2025.01); *H10D 30/6212* (2025.01);
(Continued)

(58) Field of Classification Search
CPC ........................ H10D 30/6213; H10D 30/6211
See application file for complete search history.

(56) References Cited

U.S. PATENT DOCUMENTS 7,767,560 B2 8/2010 JIn et al.
9,601,628 B2 * 3/2017 You .................... H10D 84/0158
(Continued)

FOREIGN PATENT DOCUMENTS

KR 1020130107183 A 10/2013
KR 1020140147649 A 12/2014
KR 1020150044412 A 4/2015

OTHER PUBLICATIONS

First Office Action issued on Jun. 28, 2022 by the Korean Intellectual Property Office for corresponding application KR 10-2015-0152968.
(Continued)

*Primary Examiner* — Anh D Mai
(74) *Attorney, Agent, or Firm* — Muir Patent Law, PLLC

(57) ABSTRACT

A semiconductor device can include a field insulating film on a substrate and a fin-type pattern of a particular material, on the substrate, having a first sidewall and an opposing second sidewall. The fin-type pattern can include a first portion of the fin-type pattern that protrudes from an upper surface of the field insulating film and a second portion of the fin-type pattern disposed on the first portion. A third portion of the fin-type pattern can be disposed on the second portion where the third portion can be capped by a top rounded surface of the fin-type pattern and the first sidewall can have an undulated profile that spans the first, second and third portions.

9 Claims, 21 Drawing Sheets

Related U.S. Application Data continuation of application No. 15/213,533, filed on Jul. 19, 2016, now abandoned.

(60) Provisional application No. 62/220,472, filed on Sep. 18, 2015.

(51) Int. Cl.

| | |
|---|---|
| ***H10D 84/01*** | (2025.01) |
| ***H10D 84/03*** | (2025.01) |
| ***H10D 84/80*** | (2025.01) |
| ***H10D 84/85*** | (2025.01) |

(52) U.S. Cl.

CPC ..... *H10D 30/6213* (2025.01); *H10D 84/0193* (2025.01); *H10D 84/038* (2025.01); *H10D 84/80* (2025.01); *H10D 84/853* (2025.01)

(56) References Cited

U.S. PATENT DOCUMENTS

| | | | | |
|---|---|---|---|---|
| 9,666,474 | B2 | 5/2017 | Briggs et al. | |
| 9,711,504 | B2 * | 7/2017 | You | H10D 30/6213 |
| 2009/0085027 | A1 | 4/2009 | Jin et al. | |
| 2013/0093026 | A1 | 4/2013 | Wann et al. | |
| 2013/0270612 | A1 | 10/2013 | Chien et al. | |
| 2013/0270652 | A1 | 10/2013 | Liaw | |
| 2013/0320455 | A1 | 12/2013 | Cappellani et al. | |
| 2014/0008734 | A1 | 1/2014 | Lu | |
| 2014/0099774 | A1 | 4/2014 | Vincent | |
| 2014/0299942 | A1 | 10/2014 | Baek | |
| 2014/0306272 | A1 | 10/2014 | Kuo et al. | |
| 2015/0044829 | A1 | 2/2015 | Kim et al. | |
| 2015/0076654 | A1 | 3/2015 | Ganz et al. | |
| 2015/0187571 | A1 | 7/2015 | Fan et al. | |
| 2015/0187943 | A1 | 7/2015 | Lee et al. | |
| 2015/0194426 | A1 | 7/2015 | Liu et al. | |
| 2015/0194503 | A1 | 7/2015 | Ching et al. | |
| 2015/0200252 | A1 | 7/2015 | Ching et al. | |
| 2015/0206875 | A1 | 7/2015 | Lee et al. | |
| 2015/0380241 | A1 | 12/2015 | Yu et al. | |

OTHER PUBLICATIONS

Notice of Allowance issued Dec. 15, 2022 by the Korean Intellectual Property Office for corresponding application KR 10-2015-0152968.

* cited by examiner

SEMICONDUCTOR DEVICE HAVING AN ASYMMETRIC FIN-TYPE PATTERNS FORMED BETWEEN TWO SYMMETRIC FIN-TYPE PATTERNS WITH VARYING WIDTH ALONG CENTER VERTICAL LINE OF THE FINS

CROSS-REFERENCE TO RELATED APPLICATIONS

This application is a continuation of U.S. application Ser. No. 16/751,460 filed on Jan. 24, 2020, which is a continuation of U.S. application Ser. No. 15/213,533 filed on Jul. 19, 2016, which claims priority from Korean Patent Application No. 10-2015-0152968 filed on Nov. 2, 2015 in the Korean Intellectual Property Office, and all the benefits accruing therefrom under 35 U.S.C. 119, and also claims priority from U.S. Provisional Patent Application No. 62/220,472, filed Sep. 18, 2015, and all the benefits accruing therefrom under 35 U.S.C. 119, the contents of each of which in their entirety are herein incorporated by reference.

FIELD

The present disclosure relates to semiconductor devices, and more particularly, to semiconductor devices including a fin-type pattern.

BACKGROUND

Multi-gate transistors have been used to increase the density of semiconductor devices by using a silicon body in a fin-like shape on a substrate, where gates are on the surface of the silicon body.

Multi-gate transistors can provide better scaling as a three-dimensional channel may be more compact than a planar channel. Further, current control capability can be enhanced without requiring an increase in gate length of the multi-gate transistor. Furthermore, it is possible to suppress short channel effects (SCE) through the use of multi-gate semiconductors.

SUMMARY

In some embodiments according to the inventive concept, a semiconductor device that can include a field insulating film on a substrate and a fin-type pattern of a particular material, on the substrate, having a first sidewall and an opposing second sidewall. The fin-type pattern can include a first portion of the fin-type pattern that protrudes from an upper surface of the field insulating film and a second portion of the fin-type pattern disposed on the first portion. A third portion of the fin-type pattern can be disposed on the second portion where the third portion can be capped by a top rounded surface of the fin-type pattern and the first sidewall can have an undulated profile that spans the first, second and third portions.

In some embodiments according to the inventive concept, a semiconductor device can include a first fin-type pattern on a substrate and can have a first sidewall and an opposing second sidewall and a field insulating film can be on the substrate and surround a portion of the first sidewall of the first fin-type pattern and a portion of the second sidewall of the first fin-type pattern. The first fin-type pattern can include a lower portion surrounded by the field insulating film, an upper portion protruding upward beyond an upper surface of the field insulating film, and a boundary line is defined between the upper portion of the first fin-type pattern and the lower portion of the first fin-type pattern where the upper surface of the field insulating film meets the first fin-type pattern. The upper portion of the first fin-type pattern and the lower portion of the first fin-type pattern can be the same material. The first sidewall of the first fin-type pattern can include a first point, a second point, and a third point positioned in a sequential order from an upper surface of the substrate. A width across the first fin-type pattern at the second point can be greater than a width across the first fin-type pattern at the first point and a width across the first fin-type pattern at the third point. The width across the first fin-type pattern at the second point can be less than a length of the boundary line.

In some embodiments according to the inventive concept, a semiconductor device can include a fin-type pattern on a substrate and can include a first sidewall and a second sidewall and a field insulating film can be on the substrate and can surround a portion of the first sidewall of the fin-type pattern and a portion of the second sidewall of the fin-type pattern. The fin-type pattern can include a lower portion surrounded by the field insulating film, and an upper portion protruding upward beyond an upper surface of the field insulating film. The upper portion of the fin-type pattern and the lower portion of the fin-type pattern can be same material. The upper portion of the fin-type pattern can include, on an upper surface of the field insulating film, a first portion at which a slope of the first sidewall makes an acute angle relative to an upper surface of the substrate, a second portion at which the slope of the first sidewall of the fin-type pattern makes an obtuse angle relative to the upper surface of the substrate, and a third portion at which the slope of the first sidewall of the fin-type pattern makes an acute angle relative to the upper surface of the substrate. The first to third portions can be positioned in a sequential order relative to the upper surface of the substrate where changes from the first slope to the second slope to the third slope are provided by smooth transitions in a profile of the first sidewall.

In some embodiments according to the inventive concept, a semiconductor device, can include a first fin-type pattern in a first region of a substrate and can include first and second opposing sidewalls. A second fin-type pattern can be in a second region of the substrate and can include third and fourth opposing sidewalls. A field insulating film can be on the substrate and can surround a portion of the first sidewall, a portion of a second sidewall, a portion of a third sidewall, and a portion of a fourth sidewall. The first fin-type pattern can include a lower portion surrounded by the field insulating film, an upper portion protruding upward beyond an upper surface of the field insulating film, and a boundary line defined to extend across the first fin-type pattern between the upper portion of the first fin-type pattern and the lower portion of the first fin-type pattern. The first sidewall can include a first point, a second point, and a third point positioned in a sequential order relative to an upper surface of the substrate. A width across the first fin-type pattern at the second point can be greater than a width across the first fin-type pattern at the first point and greater than a width across the first fin-type pattern at the third point. The third sidewall and the fourth sidewall can each have a slope at an acute angle relative to the upper surface of the substrate or a slope at a right angle relative to the upper surface of the substrate, as a distance from the upper surface of the substrate increases.

In some embodiments according to the inventive concept, a semiconductor device can include a first fin-type pattern and a second fin-type pattern adjacent to each other on a substrate in an SRAM region. A field insulating film can surround a portion of the first fin-type pattern and a portion of the second fin-type pattern and a gate electrode can be on the field insulating film and can cross-over the first fin-type pattern and the second fin-type pattern. The first fin-type pattern can include a first portion, a second portion, and a third portion positioned in a sequential order relative to an upper surface of the substrate. The second fin-type pattern can include a fourth portion, a fifth portion, and a sixth portion positioned in a sequential order relative to the upper surface of the substrate. A width across the first portion, a width across the third portion, a width across the fourth portion, and a width across the sixth portion can each decrease as a distance from the upper surface of the substrate increases. A width across the second portion, and a width across the fifth portion can each increase as the distance from the upper surface of the substrate increases, and a width across the first fin-type pattern at a boundary between the first portion and the second portion can be different from a width across the second fin-type pattern at a boundary between the fourth portion and the fifth portion.

In some embodiments according to the inventive concept, a semiconductor device can include a fin-type pattern on a substrate and a field insulating film on the substrate and surrounding a portion of a sidewall of the fin-type pattern. The fin-type pattern can include a lower portion surrounded by the field insulating film, an upper portion protruding upward beyond an upper surface of the field insulating film. The upper portion of the fin-type pattern and the lower portion of the fin-type pattern can be the same material. The upper portion of the fin-type pattern can include a first portion, a second portion, and a third portion positioned in a sequential order relative to the upper surface of the field insulating film. A width across the first portion of the upper portion of the fin-type pattern can decrease as a distance from an upper surface of the substrate increases. A width across the second portion of the upper portion of the fin-type pattern can increase as the distance from the upper surface of the substrate increases and a width across the third portion of the upper portion of the fin-type pattern can decrease as the distance from the upper surface of the substrate increases.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EMBODIMENTS ACCORDING TO THE INVENTIVE CONCEPT

Figure 1:
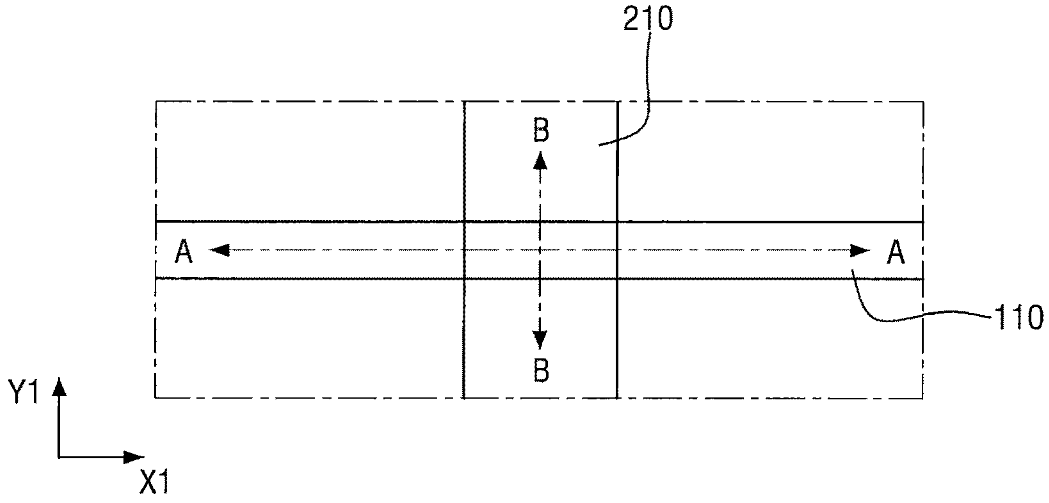
FIG. 1 is a layout diagram provided to explain a semiconductor device according to a exemplary embodiments.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the invention to those skilled in the art, and the present inventive concept will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Although the drawings regarding a semiconductor device according to some exemplary embodiments exemplify a fin-type transistor comprising a channel region in a fin-type pattern shape, exemplary embodiments are not limited thereto. A semiconductor device according to some exemplary embodiments may include a tunneling transistor (tunneling FET), a bipolar junction transistor, a laterally diffused metal oxide semiconductor (LDMOS) transistor, and so on.

Hereinbelow, a semiconductor device according to some exemplary embodiments will be explained with reference to FIGS. 1 to 5.

Figure 2:
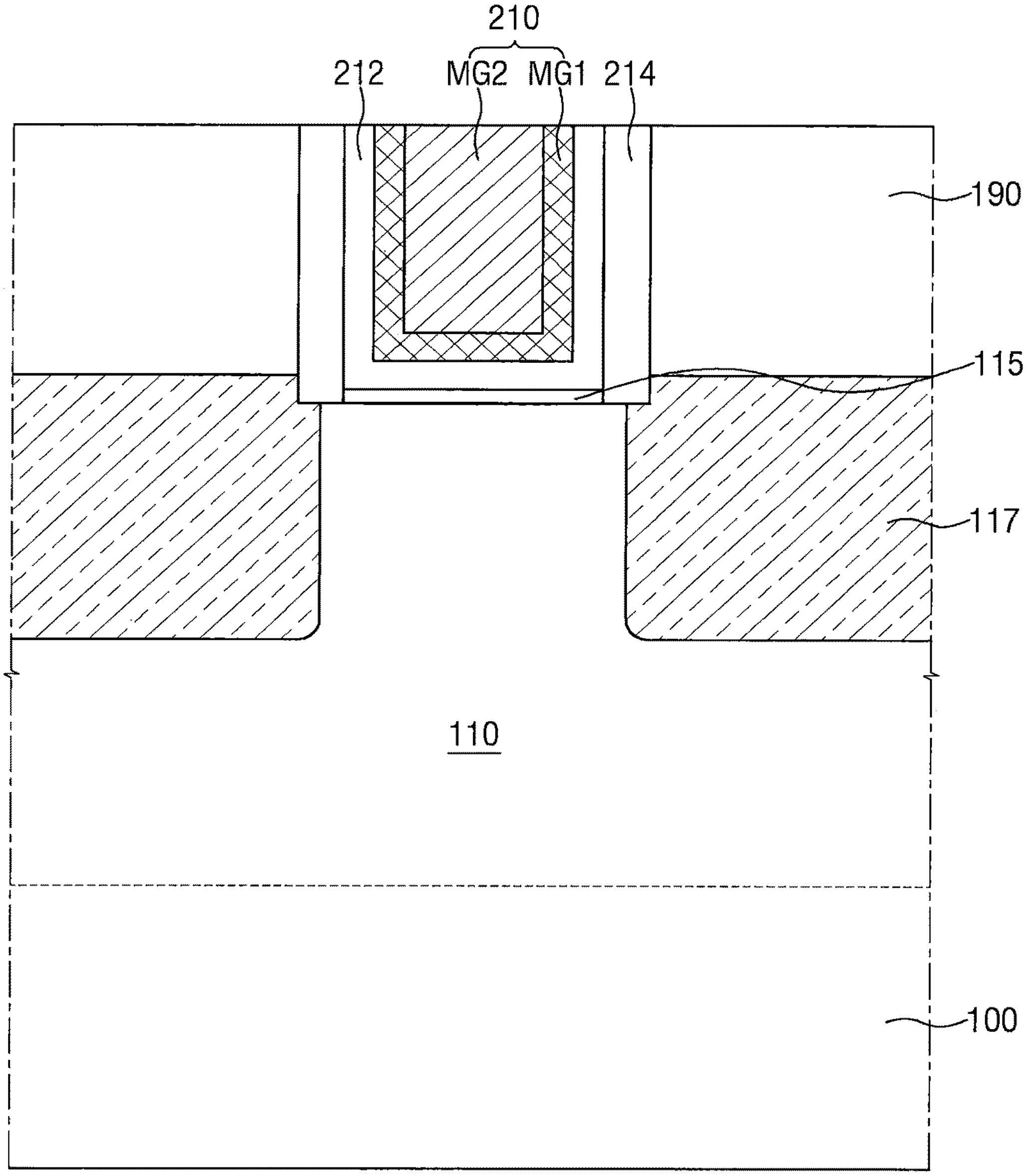
FIG. 2 is a cross sectional view taken on line A-A of FIG. 1.
Figure 3A:
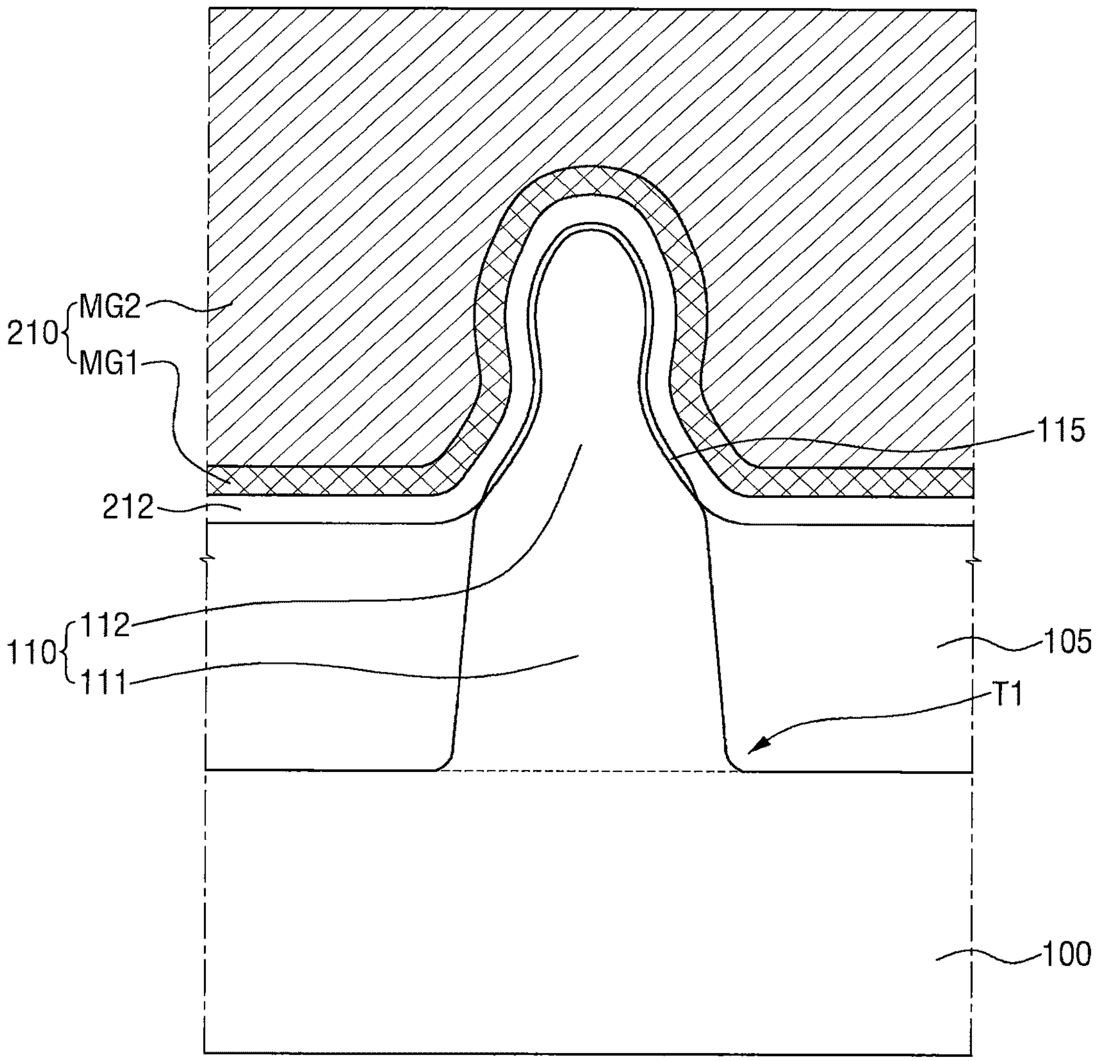
FIGS. 3A to 3C are cross sectional views taken on line B-B of FIG. 1.
Figure 3B:
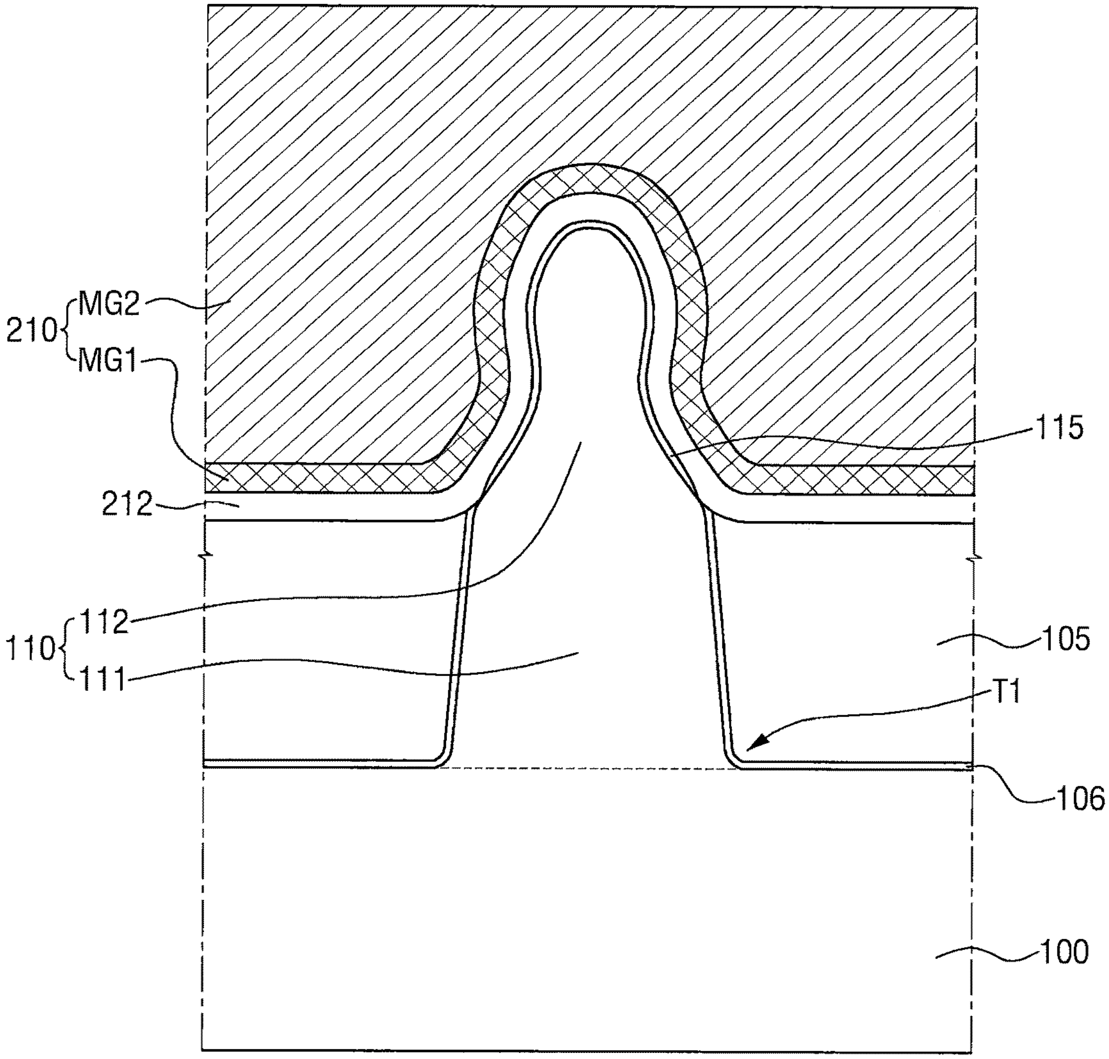
Figure 3C:
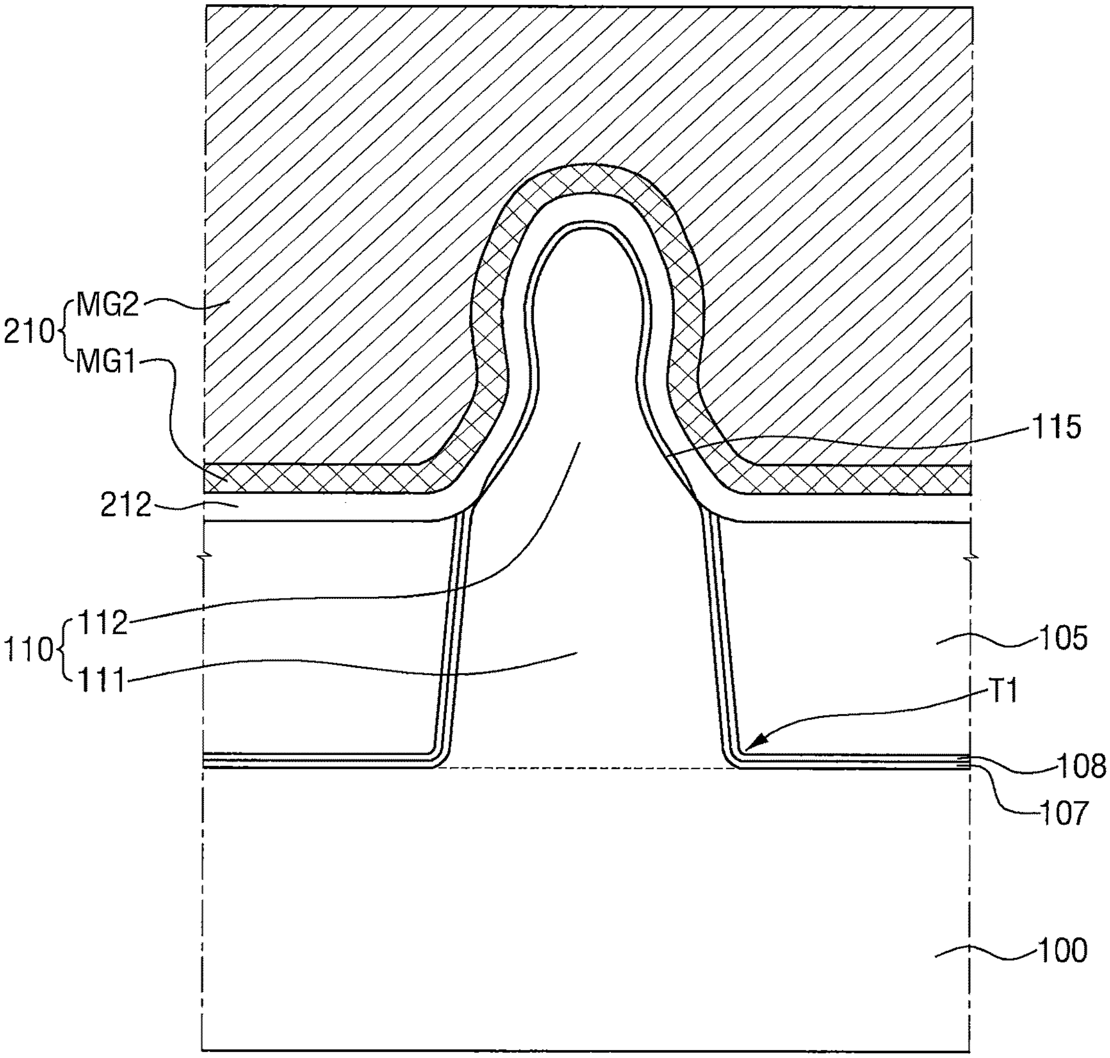
Figure 4:
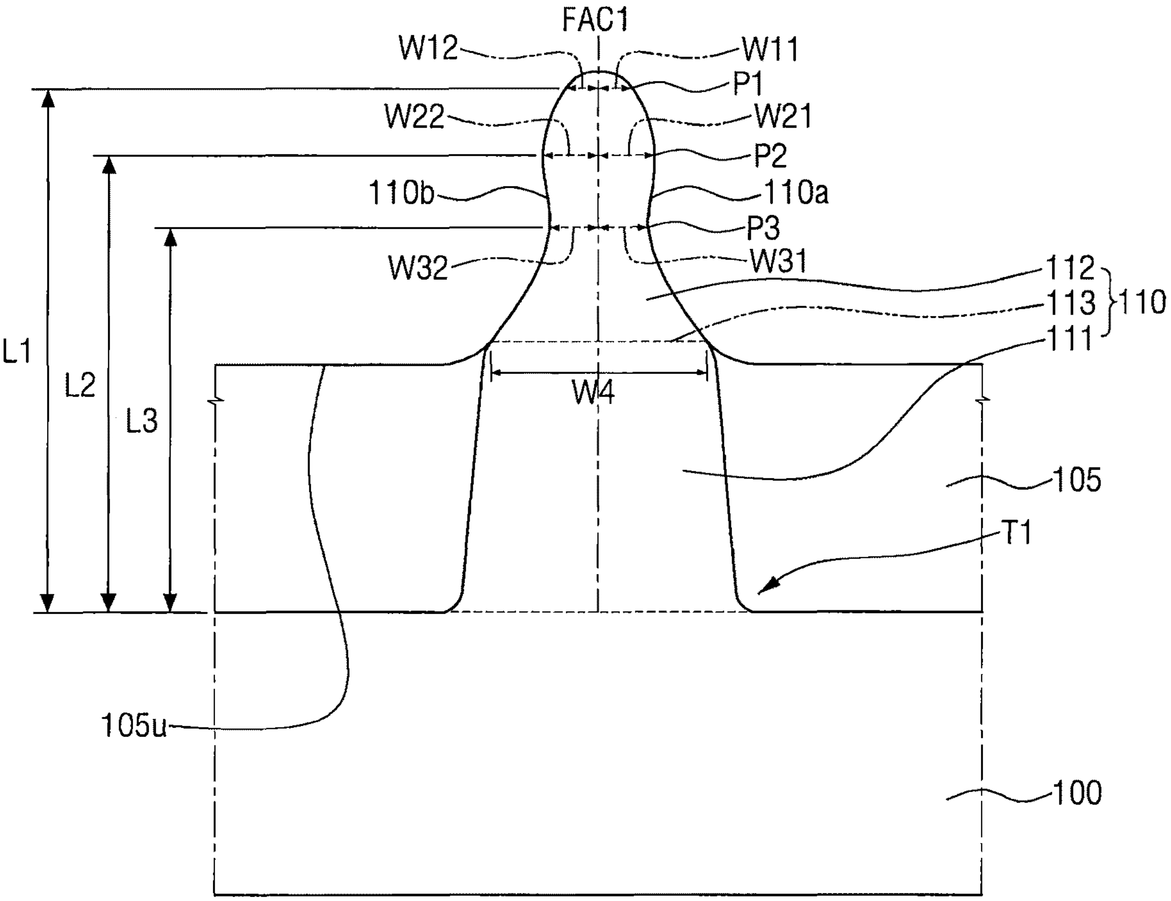
FIGS. 4 and 5 are views of FIG. 3A from which the first gate electrode and the gate insulating film are omitted.
Figure 5:
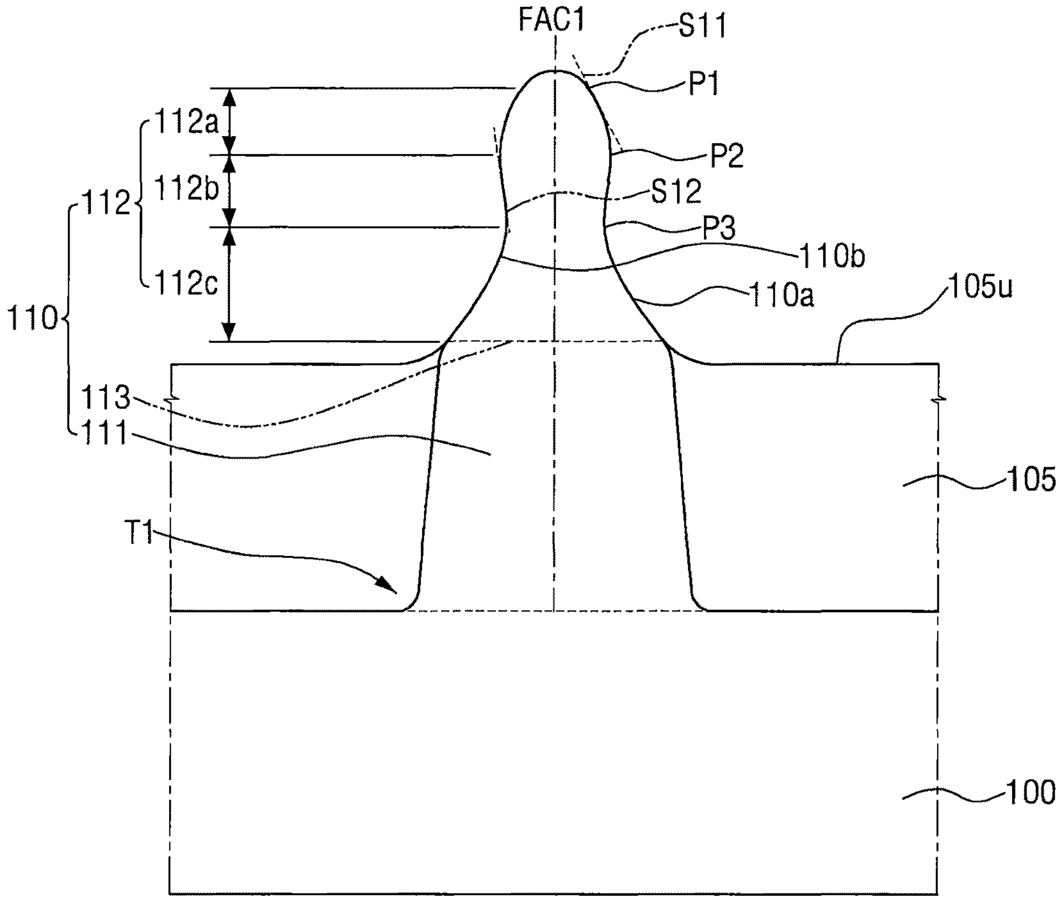

FIG. 1 is a layout diagram provided to explain a semiconductor device according to an exemplary embodiments; FIG. 2 is a cross sectional view taken on line A-A of FIG. 1. FIGS. 3A to 3C are cross sectional views taken on line B-B of FIG. 1. FIGS. 4 and 5 are views of FIG. 3A from which the first gate electrode and the gate insulating film are omitted.

Referring to FIGS. 1 and 5, a semiconductor device according to exemplary embodiments may include a first fin-type pattern 110 and a first gate electrode 210.

The first fin-type pattern 110 may extend longitudinally on the substrate 100, in a first direction X1. The first fin-type pattern 110 may protrude from the substrate 100. The first fin-type pattern 110 may be defined by a first trench T1.

The first fin-type pattern 110 may include a first sidewall 110*a* and a second sidewall 110*b* opposing each other. The first sidewall 110*a* of the first fin-type pattern and the second sidewall 110*b* of the first fin-type pattern may be the sidewalls extending in the first direction X1.

The first sidewall 110*a* of the first fin-type pattern and the second sidewall 110*b* of the first fin-type pattern 110 may define a sidewall of the first trench T1 that defines the first fin-type pattern 110, and an upper surface of the substrate 100 may define a bottom surface of the first trench T1.

The substrate 100 may be a silicon substrate, a bulk silicon or a silicon-on-insulator (SOI), for example. Alternatively, the substrate 100 may include an element semiconductor such as germanium, or a compound semiconductor such as a IV-IV group compound semiconductor or a III-V group compound semiconductor, for example. Alternatively, the substrate 100 may be a base substrate having an epitaxial layer formed thereon.

The IV-IV group compound semiconductor may be a binary compound or a ternary compound including at least two or more of carbon (C), silicon (Si), germanium (Ge), and tin (Sn), or the binary or the ternary compound doped with a IV group element.

The III-V group compound semiconductor may be one of a binary compound, ternary compound and quaternary compound which is formed by a combination of at least one of aluminum (Al), gallium (Ga), and indium (In) as a III group element, with one of phosphorus (P), arsenic (As) and antimony (Sb) as a V group element.

As illustrated in FIG. 1, the first fin-type pattern 110 may be in a rectangular shape, but exemplary embodiments are not limited thereto. The first fin-type pattern 110 in the rectangular shape may include a long side and a short side.

The field insulating film 105 may be formed on the substrate 100 and disposed around the first fin-type pattern 110. The field insulating film 105 may fill a portion of the first trench T1.

The field insulating film 105 may be formed to surround a portion of the first fin-type pattern 110. The first fin-type pattern 110 may be defined by the field insulating film 105. A portion of the first fin-type pattern 110 may protrude upward beyond an upper surface 105*u* of the field insulating film.

The field insulating film 105 may surround a portion of the first sidewall 110*a* of the first fin-type pattern 110, and surround a portion of the second sidewall 110*b* of the first fin-type pattern 110.

The field insulating film 105 may include, for example, oxide film, nitride film, oxynitride film, or a film combining the above.

More specifically, the first fin-type pattern 110 may include an upper portion 112 and a lower portion 111. The first fin-type pattern 110 may include a first boundary line 113 between the upper portion 112 of the first fin-type pattern and the lower portion 111 of the first fin-type pattern 110.

The field insulating film 105 may surround the lower portion 111 of the first fin-type pattern 110. However, the field insulating film 105 does not surround the first sidewall 110*a* and the second sidewall 110*b* of the upper portion 112 of the first fin-type pattern 110.

That is, the upper portion 112 of the first fin-type pattern 110 may be the portion that protrudes upward beyond the upper surface 105*u* of the field insulating film.

The first boundary line 113 may be a boundary between the lower portion 111 of the first fin-type pattern 110 surrounded by the field insulating film 105, and the upper portion 112 of the first fin-type pattern 110 exposed by the field insulating film 105. When the field insulating film 105 is in contact with the first fin-type pattern 110, the first boundary line 113 may be a line that connects points where an uppermost surface of the field insulating film 105 meets the first sidewall 110*a* and the second sidewall 110*b*.

The upper portion 112 of the first fin-type pattern 110 and the lower portion 111 of the first fin-type pattern 110 may include the same material.

In the semiconductor device according to some exemplary embodiments, the first fin-type pattern 110 is a silicon fin-type pattern. That is, the upper portion 112 of the first fin-type pattern 110 and the lower portion 111 of the first fin-type pattern 110 may be an upper portion and a lower portion of a silicon fin-type pattern, respectively.

The shape of the first fin-type pattern 110 is described above with reference to FIGS. 4 and 5.

Additionally, in FIG. 3B, a first field liner 106 may be formed between the field insulating film 105 and the first fin-type pattern 110, and between the field insulating film 105 and the substrate 100.

More specifically, the first field liner 106 may be formed along the sidewall of the lower portion 111 of the first fin-type pattern 110, and the upper surface of the substrate 100.

For example, the first field liner 106 may include at least one of polysilicon, amorphous silicon, silicon oxynitride, silicon nitride, or silicon oxide.

Additionally, in FIG. 3C, a second field liner 107 and a third field liner 108 may be formed between the field insulating film 105 and the first fin-type pattern 110, and between the field insulating film 105 and the substrate 100.

More specifically, the second field liner 107 may be formed along the sidewall of the lower portion 111 of the first fin-type pattern 110, and the upper surface of the substrate 100.

The third field liner 108 may be formed on the second field liner 107. The third field liner 108 may be formed along the second field liner 107.

The second field liner 107 may include, for example, polysilicon or amorphous silicon. The third field liner 108 may include, for example, silicon oxide.

The first gate electrode 210 may be formed so as to extend in the second direction Y1, thus intersecting the first fin-type pattern 110. The first gate electrode 210 may be disposed on the first fin-type pattern 110 and the field insulating film 105.

The first gate electrode 210 may include metal layers MG1, MG2. As illustrated, the first gate electrode 210 may include a stack of two or more metal layers MG1, MG2. The first metal layer MG1 is selected to adjust a work function, and the second metal layer MG2 fills a space defined by the first metal layer MG1.

For example, the first metal layer MG1 may include at least one of, for example, TiN, WN, TiAl, TiAlN, TaN, TiC, TaC, TaCN, TaSiN or a combination thereof, but not limited thereto. Further, the first metal layer MG1 may include an oxidized form of the materials described above.

Further, the second metal layer MG2 may include at least one of, for example, W, Al, Cu, Co, Ti, Ta, or a metal alloy, but not limited thereto. For example, the first gate electrode 210 described above may be formed by replacement process (or gate last process), but not limited thereto.

Gate insulating films 115, 212 may be formed between the first fin-type pattern 110 and the first gate electrode 210. The gate insulating films 115, 212 may include an interfacial film 115 and a high-k dielectric insulating film 212.

The interfacial film 115 may be formed by partially oxidizing the first fin-type pattern 110. For example, the interfacial film 115 may be formed by partially oxidizing the upper portion 112 of the first fin-type pattern 110.

The interfacial film 115 may be formed along a profile of the first fin-type pattern 110 protruding upward beyond the upper surface 105*u* of the field insulating film. When the first fin-type pattern 110 is a silicon fin-type pattern including silicon, the interfacial film 115 may include a silicon oxide film.

In some embodiments, the interfacial film 115 may be formed along the profile of the upper portion 112 of the first fin-type pattern 110, and the upper surface 105*u* of the field insulating film. In such case, the interfacial film 115 may be formed by deposition method.

The high-k dielectric insulating film 212 may be formed between the interfacial film 115 and the first gate electrode 210. It may be formed along the profile of the first fin-type pattern 110 protruding upward beyond the upper surface 105*u* of the field insulating film. Further, the high-k dielectric insulating film 212 may be formed between the first gate electrode 210 and the field insulating film 105.

For example, the high-k dielectric insulating film 212 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Further, while the high-k dielectric insulating film 212 described above is explained mainly with respect to the oxides, alternatively, the high-k dielectric insulating film 212 may include one or more of the nitride (e.g., hafnium nitride) or the oxynitride (e.g., hafnium oxynitride) of the metal materials described above, but not limited thereto.

A gate spacer 214 may be disposed on a sidewall of the first gate electrode 210 extending in the second direction Y1.

The high-k dielectric insulating film 212 may be positioned between the sidewall of the first gate electrode 210 and a gate spacer 214.

The gate spacer 214 may include, for example, at least one of silicon nitride (SiN), silicon oxynitride (SiON), silicon oxide ($SiO_2$), silicon oxycarbonitride (SiOCN), and a combination thereof.

While the gate spacer 214 is illustrated as a single film, this is only for convenience of explanation and exemplary embodiments are not limited thereto. When the gate spacer 214 is a plurality of films, at least one film of the gate spacer 214 may include a low-k dielectric material such as silicon oxycarbonitride (SiOCN).

Further, when the gate spacer 214 is a plurality of films, at least one film of the gate spacer 214 may have an L-shape.

The source/drain 117 may be formed on both sides of the first gate electrode 210, and on the first fin-type pattern 110. The source/drain 117 may include an epitaxial pattern formed by an epitaxy process. For example, the source/drain 117 may be an elevated source/drain.

When the semiconductor device according to some exemplary embodiments is a PMOS transistor, the source/drain 117 may include a compressive stress material. For example, the compressive stress material may be a material having a lattice constant that is greater than Si, such as SiGe, for example. For example, the compressive stress material can enhance mobility of the carrier in the channel region by exerting compressive stress on the first fin-type pattern 110.

Alternatively, when the semiconductor device according to some exemplary embodiments is an NMOS transistor, the source/drain 117 may include a tensile stress material. For example, when the first fin-type pattern 110 is silicon, the source/drain 117 may be a material (e.g., SiC) which has a lattice constant that is less than silicon. For example, the tensile stress material can enhance mobility of the carrier in the channel region by exerting tensile stress on the first fin-type pattern 110.

When the semiconductor device according to some exemplary embodiments is an NMOS transistor, the source/drain 117 may include the same material as the first fin-type pattern 110, i.e., silicon.

An interlayer insulating film 190 may be formed on the source/drain 117. The interlayer insulating film 190 may surround the outer sidewall of the gate spacer 214.

The interlayer insulating film 190 may include at least one of silicon oxide, silicon nitride, silicon oxynitride, and a low-k dielectric material, for example. For example, the low-k dielectric material may include flowable oxide (FOX), Tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

While the interlayer insulating film 190 is illustrated as a single layer, exemplary embodiments are not limited thereto. Accordingly, a plurality of layers may be included. Further, at least a portion of the interlayer insulating film 190 may include an impurity such as silicon or germanium, for example.

Referring to FIGS. 4 and 5, the first fin-type pattern 110 may include a first fin center line FAC1 that is orthogonal to the first boundary line 113 and meets an uppermost portion of the first fin-type pattern 110. That is, the first fin center line FAC1 may meet the uppermost portion of the upper portion 112 of the first fin-type pattern 110.

In this example, the uppermost portion of the first fin-type pattern 110 may be a point that is met as a line parallel to the first boundary line 113 is moved to the end of the first fin-type pattern 110. Further, when the uppermost portion forms a planar surface, the uppermost portion of the first fin-type pattern 110 may be an intermediate point of the planar surface.

The first sidewall 110*a* of the first fin-type pattern 110 may include a third point P3, a second point P2, and a first point P1, positioned in a sequential order from the upper surface of the substrate 100.

More specifically, a distance L2 from the upper surface of the substrate 100 to the second point P2 may be less than a distance L1 from the upper surface of the substrate 100 to the first point P1, and greater than a distance L3 from the upper surface of the substrate 100 to the third point P3.

In a semiconductor device according to some exemplary embodiments, the first point P1, the second point P2, and the third point P3 may be positioned higher than the upper surface 105*u* of the field insulating film 105.

The first sidewall 110*a* of the upper portion 112 of the first fin-type pattern 110 may include the first point P1, the second point P2, and the third point P3. In other words, the first point P1, the second point P2, and the third point P3 may be positioned farther away from the upper surface of the substrate 100 than the first boundary line 113 of the first fin-type pattern 110.

In a semiconductor device according to some exemplary embodiments, a width (W21+W22) of the first fin-type pattern 110 at the second point P2 may be greater than a width (W11+W12) of the first fin-type pattern 110 at the first point P1. Further, the width (W21+W22) of the first fin-type pattern 110 at the second point P2 may be greater than a width (W31+W32) of the first fin-type pattern 110 at the third point P3.

That is, the width of the first fin-type pattern 110 may include a portion which decreases, increases and then decreases again in width, as a distance from the upper surface 105*u* of the field insulating film increases.

Additionally, in a semiconductor device according to some exemplary embodiments, the width (W21+W22) of the first fin-type pattern 110 at the second point P2 may be smaller than a width W4 of the first fin-type pattern 110 at the first boundary line 113.

In this case, the width of the first fin-type pattern 110 may be a distance between the first sidewall 110*a* and the second sidewall 110*b* at each of the points.

More specifically, the width of the first fin-type pattern 110 at the first point P1 may be a sum of a width W11 between the first fin center line FAC1 and the first sidewall 110*a* of the first fin-type pattern 110, and a width W12 between the first fin center line FAC1 and the second sidewall 110*b* of the first fin-type pattern 110. The width of the first fin-type pattern 110 at the second point P2 may be a sum of a width W21 between the first fin center line FAC1 and the first sidewall 110*a* of the first fin-type pattern 110, and a width W22 between the first fin center line FAC1 and the second sidewall 110*b* of the first fin-type pattern 110. The width of the first fin-type pattern 110 at the third point P3 may be a sum of a width W31 between the first fin center line FAC1 and the first sidewall 110*a* of the first fin-type pattern 110, and a width W32 between the first fin center line FAC1 and the second sidewall 110*b* of the first fin-type pattern 110.

In FIG. 4, the width W21 at the second point P2 between the first fin center line FAC1 and the first sidewall 110*a* of the first fin-type pattern 110 may be greater than the width W11 at the first point P1 between the first fin center line FAC1 and the first sidewall 110*a* of the first fin-type pattern 110, and the width W31 at the third point P3 between the first fin center line FAC1 and the first sidewall 110*a* of the first fin-type pattern 110.

Further, the width W22 at the second point P2 between the first fin center line FAC1 and the second sidewall 110*b* of the first fin-type pattern 110 may be greater than the width W12 at the first point P1 between the first fin center line FAC1 and the second sidewall 110*b* of the first fin-type pattern 110, and the width W32 at the third point P3 between the first fin center line FAC1 and the second sidewall 110*b* of the first fin-type pattern 110.

In this case, at the second point P2, the width W21 between the first fin center line FAC1 and the first sidewall 110*a* of the first fin-type pattern 110 may be equal to the width W22 between the first fin center line FAC1 and the second sidewall 110*b* of the first fin-type pattern 110, although these may be different.

Likewise, at the first point P1, the width W11 between the first fin center line FAC1 and the first sidewall 110*a* of the first fin-type pattern 110 may be equal to the width W12 between the first fin center line FAC1 and the second sidewall 110*b* of the first fin-type pattern 110, although these may be different. Further, at the third point P3, the width W31 between the first fin center line FAC1 and the first sidewall 110*a* of the first fin-type pattern 110 may be equal to the width W32 between the first fin center line FAC1 and the second sidewall 110*b* of the first fin-type pattern 110, although these may be different.

Referring to FIG. 5, the first fin-type pattern 110 may include a first portion 112*a* and a third portion 112*c* where the width of the first fin-type pattern 110 decreases as a distance from the upper surface of the substrate 100 increases. Further, the first fin-type pattern 110 may include a second portion 112*b* where the width of the first fin-type pattern 110 increases as the distance from the upper surface of the substrate 100 increases.

The second portion 112*b* of the first fin-type pattern 110 may be positioned between the first portion 112*a* of the first fin-type pattern 110 and the third portion 112*c* of the first fin-type pattern 110. That is, the first fin-type pattern 110 may include a portion where the width of the first fin-type pattern 110 sequentially decreases, increases, and decreases again as the distance from the upper surface of the substrate 100 increases.

In a semiconductor device according to some exemplary embodiments, the upper portion 112 of the first fin-type pattern 110 may include the third portion 112*c* of the first fin-type pattern 110, the second portion 112*b* of the first fin-type pattern 110, and the first portion 112*a* of the first fin-type pattern 110.

The third portion 112*c* of the first fin-type pattern 110, the second portion 112*b* of the first fin-type pattern 110, and the first portion 112*a* of the first fin-type pattern 110 may be positioned in a sequential order from the upper surface 105*u* of the field insulating film.

For example, the second point P2 may be positioned at a boundary between the second portion 112*b* of the first fin-type pattern 110 and the first portion 112*a* of the first fin-type pattern 110. That is, the second point P2 may be positioned at a boundary where the increasing width of the first fin-type pattern 110 begins decreasing.

At the third portion 112*c* of the first fin-type pattern 110 where the width decreases as the distance from the upper surface of the substrate 100 increases, the slope S11 of the first sidewall 110*a* of the first fin-type pattern 110 may make an acute angle relative to the upper surface of the substrate 100. In other words, at the third portion 112*c* of the first fin-type pattern 110, the first sidewall 110*a* of the first fin-type pattern 110 may have a slope at an acute angle.

At the second portion 112*b* of the first fin-type pattern 110 where the width increases as the distance from the upper surface of the substrate 100 increases, the slope S11 of the first sidewall 110*a* of the first fin-type pattern 110 may make an obtuse angle.

At the first portion 112*a* of the first fin-type pattern 110 where the width decreases as the distance from the upper surface of the substrate 100 increases, the slope S11 of the first sidewall 110*a* of the first fin-type pattern 110 may make an acute angle.

In a semiconductor device according to some exemplary embodiments, the first sidewall 110*a* of the first fin-type pattern 110 may include a portion that has a slope at an acute angle, then a slope at an obtuse angle, and then a slope at an acute angle again.

For example, as the distance from the upper surface 105*u* of the field insulating film increases, the first sidewall 110*a* of the upper portion 112 of the first fin-type pattern 110 may have a slope at an acute angle, then a slope at an obtuse angle, and then a slope at an acute angle again.

Further, in FIG. 5, at the third portion 112*c* of the first fin-type pattern 110 where the width decreases as the distance from the upper surface of the substrate 100 increases, the slope S12 of the second sidewall 110*b* of the first fin-type pattern 110 may make an acute angle.

At the second portion 112*b* of the first fin-type pattern 110 where the width increases as the distance from the upper surface of the substrate 100 increases, the slope S12 of the first sidewall 110*a* of the first fin-type pattern 110 may make an obtuse angle.

At the first portion 112*a* of the first fin-type pattern 110 where the width decreases as the distance from the upper surface of the substrate 100 increases, the slope S12 of the first sidewall 110*a* of the first fin-type pattern 110 may make an acute angle.

In FIG. 5, for example, the second sidewall 110*b* of the upper portion 112 of the first fin-type pattern 110 may have a slope at an acute angle, then a slope at an obtuse angle, and then a slope at an acute angle again, as the distance from the upper surface 105*u* of the field insulating film increases.

With reference to the first fin center line FAC1 as a center, the first sidewall 110*a* of the upper portion 112 of the first fin-type pattern 110 and the second sidewall 110*b* of the upper portion 112 of the first fin-type pattern 110 may each have a slope at an acute angle, then a slope at an obtuse angle, and then a slope at an acute angle again.

In this case, the slope of the first sidewall 110*a* of the first fin-type pattern 110 may be an angle defined between a slope of a tangent line to an arbitrary point on the first sidewall 110*a* of the first fin-type pattern 110, and the first boundary line 113.

In other words, when the slope of the sidewall of the first fin-type pattern 110 makes an acute angle, as the distance from the upper surface of the substrate 100 increases, distance between the tangent line to the arbitrary point and the first fin center line FAC1 may decrease. In contrast, when the slope of the sidewall of the first fin-type pattern 110 makes an obtuse angle, distance between the tangent line to the arbitrary point and the first fin center line FAC1 may increase as the distance from the upper surface of the substrate 100 increases.

For example, the slope S11 of the first sidewall 110*a* of the first fin-type pattern 110 illustrated in FIG. 5 may make an acute angle, and the slope S12 of the second sidewall 110*b* of the first fin-type pattern 110 illustrated in FIG. 5 may make an obtuse angle.

The uppermost portion of the first fin-type pattern 110 may make a round shape. That is, the uppermost portion of the upper portion 112 of the first fin-type pattern 110 may make a round shape. That is, the uppermost portion of the first fin-type pattern 110 may be non-planar.

Accordingly, as shown in FIG. 5 for example, in some embodiments according to the inventive concept, a profile of the at least one of the sidewalls of the fin-type pattern 110 can have an undulated shape (such as a wave shape) so that the width across the pattern (relative to a center line of the pattern) varies with the undulated profile. As shown, the undulated profile can provide for at least one peak protrusion (relative to the directly adjacent portions) between the first and second portions and a trough between the first and second portions. As further shown, the undulated profile can span (or be defined by the combined respective profiles of) the first through third portions. Further, the first portion can be capped by a top rounded surface of the fin-type pattern. Still further, the respective profiles of the opposite sidewalls can be symmetrical or asymmetrical to one another depending on the spacing between the respective sidewall and the facing sidewall of the directly adjacent fin-type pattern, which can be generated by the load factor associated with the spacing. In some embodiments, the fin-type pattern can be only silicon.

Figure 6:
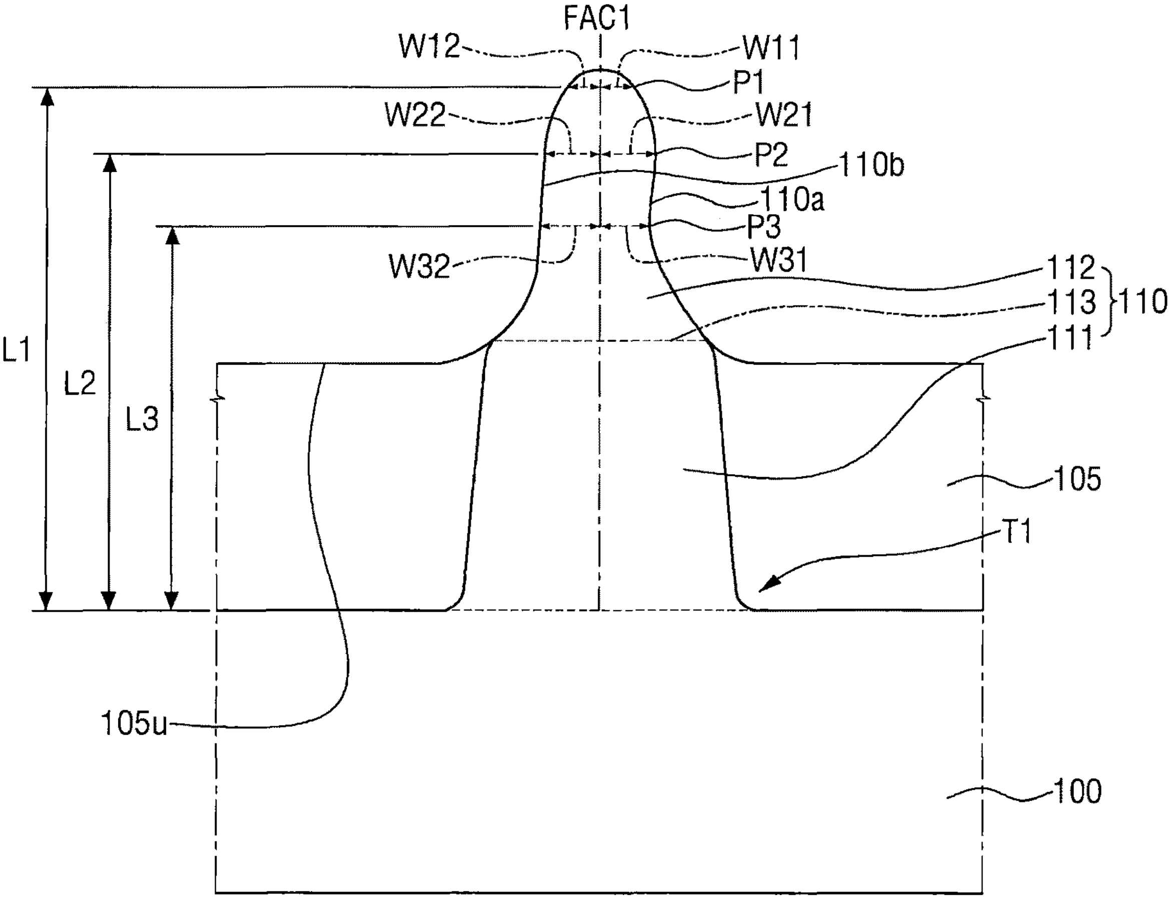
FIGS. 6 and 7 are views provided to explain a semiconductor device according to exemplary embodiments.
Figure 7:
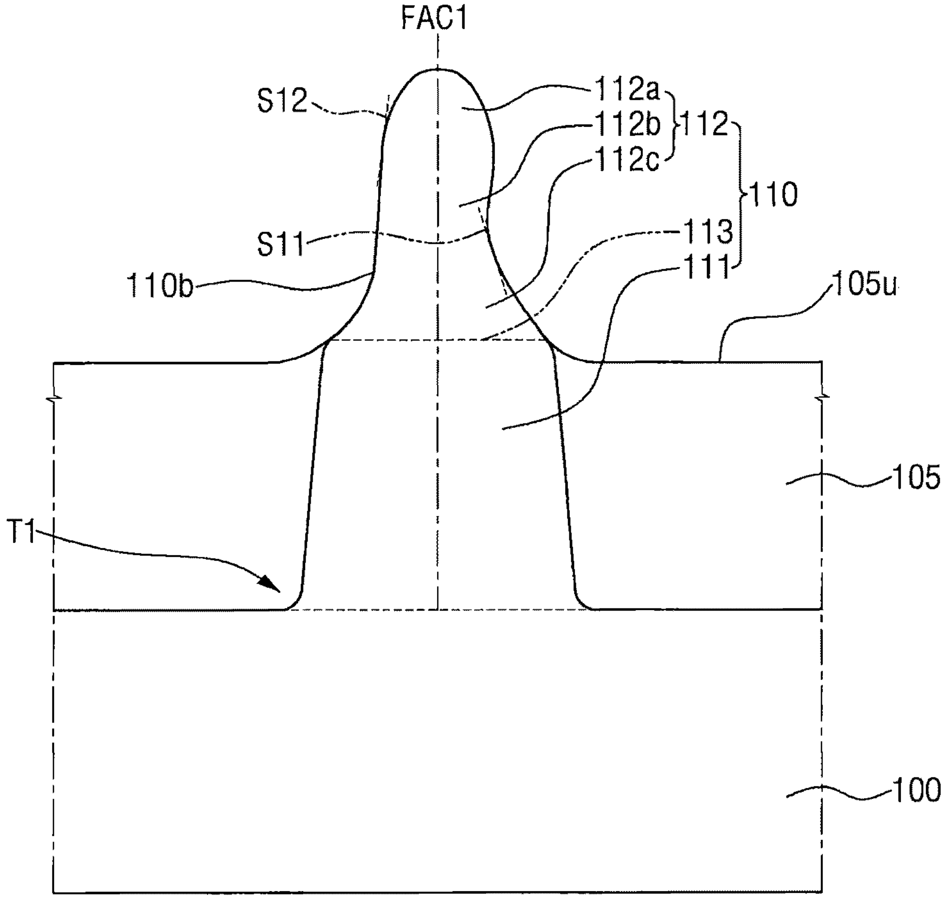

FIGS. 6 and 7 are views provided to explain a semiconductor device according to some exemplary embodiments.

Referring to FIGS. 6 and 7, in a semiconductor device according to some exemplary embodiments, the first sidewall 110*a* of the upper portion 112 of the first fin-type pattern 110 may have a slope at an acute angle, then a slope at an obtuse angle, and then a slope at an acute angle again relative to the first boundary line 113.

However, the second sidewall 110*b* of the upper portion 112 of the first fin-type pattern 110 may have a slope at an acute angle or at a right angle.

That is, above the upper surface 105*u* of the field insulating film, the slope S12 of the second sidewall 110*b* of the first fin-type pattern 110 may make an acute angle or a right angle.

Accordingly, with reference to the first fin center line FAC1, the slope variation of the second sidewall 110*b* of the upper portion 112 of the first fin-type pattern 110 may have a pattern different from the slope variation of the first sidewall 110*a* of the upper portion 112 of the first fin-type pattern 110 to provide respective asymmetric profiles for each sidewall.

Additionally, the width W22 at the second point P2 between the first fin center line FAC1 and the second sidewall 110*b* of the first fin-type pattern 110 may be equal to, or greater than the width W12 at the first point P1 between the first fin center line FAC1 and the second sidewall 110*b* of the first fin-type pattern 110, and may be equal to, or less than the width W32 at the third point P3 between the first fin center line FAC1 and the second sidewall 110*b* of the first fin-type pattern 110.

In other words, as the distance from the upper surface of the substrate 100 increases, the width between the first fin center line FAC1 and the second sidewall 110*b* of the first fin-type pattern 110 may decrease. That is, above the upper surface 105*u* of the field insulating film, the width between the first fin center line FAC1 and the second sidewall 110*b* of the first fin-type pattern 110 may only decrease.

Figure 8:
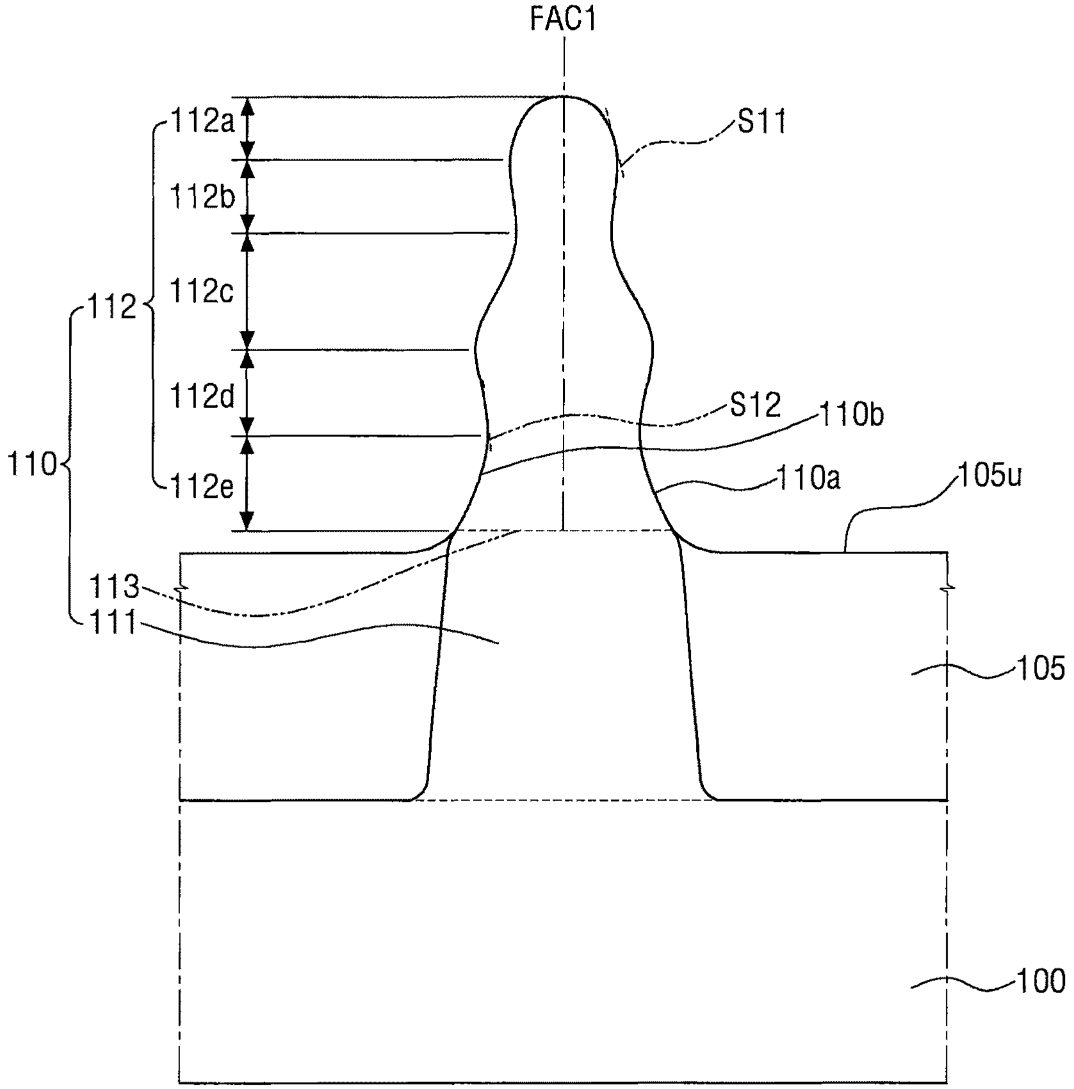
FIG. 8 is a view provided to explain a semiconductor device according to exemplary embodiments.

FIG. 8 is a view provided to explain a semiconductor device according to some exemplary embodiments.

Referring to FIG. 8, in a semiconductor device according to some exemplary embodiments, the first fin-type pattern 110 may additionally include a fourth portion 112*d* and a fifth portion 112*e* between the substrate 100 and the third portion 112*c* of the first fin-type pattern 110.

As the distance from the upper surface of the substrate 100 increases, the width of the first fin-type pattern 110 at a fifth portion 112*e* of the first fin-type pattern 110 may decrease. As the distance from the upper surface of the substrate 100 increases, the width of the first fin-type pattern 110 at a fourth portion 112*d* of the first fin-type pattern 110 may increase.

Between the substrate 100 and the third portion 112*c* of the first fin-type pattern 110, the fifth portion 112*e* of the first fin-type pattern 110 and the fourth portion 112*d* of the first fin-type pattern 110 may be positioned sequentially on the upper surface of the substrate 100.

The fifth portion 112*e* of the first fin-type pattern 110 and the fourth portion 112*d* of the first fin-type pattern 110 may be included in the upper portion 112 of the first fin-type pattern 110. That is, the first to fifth portions 112*a*, 112*b*. 112*c*, 112*d*, 112*e* of the first fin-type pattern 110 may be positioned beyond the upper surface 105*u* of the field insulating film.

Beyond the upper surface 105*u* of the field insulating film, the width of the first fin-type pattern 110 may decrease, increase, decrease, increase, and then decrease. The first fin-type pattern 110 may include a portion where the width of the first fin-type pattern 110 decreases, increases, decreases, increases, and then decreases again, as the distance from the upper surface of the substrate 100 increases.

At a boundary between the first portion 112*a* of the first fin-type pattern 110 and the second portion 112*b* of the first fin-type pattern 110, the width of the first fin-type pattern 110 may be less than the length of the first boundary line 113. Further, at a boundary between the third portion 112*c* of the first fin-type pattern 110 and the fourth portion 112*d* of the first fin-type pattern 110, the width of the first fin-type pattern 110 may be less than the length of the first boundary line 113.

At the fourth portion 112*d* of the first fin-type pattern 110 where the width increases as the distance from the upper surface of the substrate 100 increases, the slope S11 of the first sidewall 110*a* of the first fin-type pattern 110 may make an obtuse angle relative to the first boundary line 113. In other words, at the fourth portion 112*d* of the first fin-type pattern 110, the first sidewall 110*a* of the first fin-type pattern 110 may have a slope that forms an obtuse angle.

At the fifth portion 112*e* of the first fin-type pattern 110 where the width decreases as the distance from the upper surface of the substrate 100 increases, the slope S11 of the first sidewall 110*a* of the first fin-type pattern 110 may make an acute angle relative to the first boundary line 113.

The first sidewall 110*a* of the first fin-type pattern 110 may include a portion that has a slope at an acute angle, then a slope at an obtuse angle, then a slope at an acute angle, then a slope at an obtuse angle, and then a slope at an acute angle again.

As illustrated in FIG. 8, the second sidewall 110*b* of the first fin-type pattern 110 may have a similar slope variation as the first sidewall 110*a* of the first fin-type pattern 110, but this is provided only for convenience of explanation and exemplary embodiments are not limited thereto.

Figure 9:
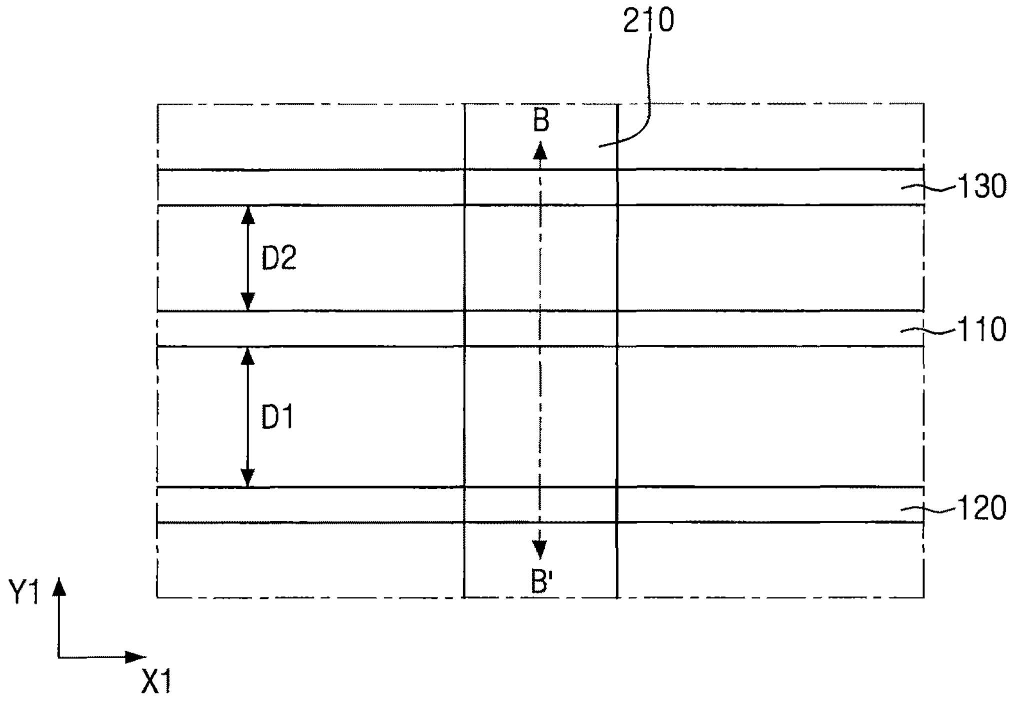
FIG. 9 is a layout diagram provided to explain a semiconductor device according to exemplary embodiments.
Figure 10:
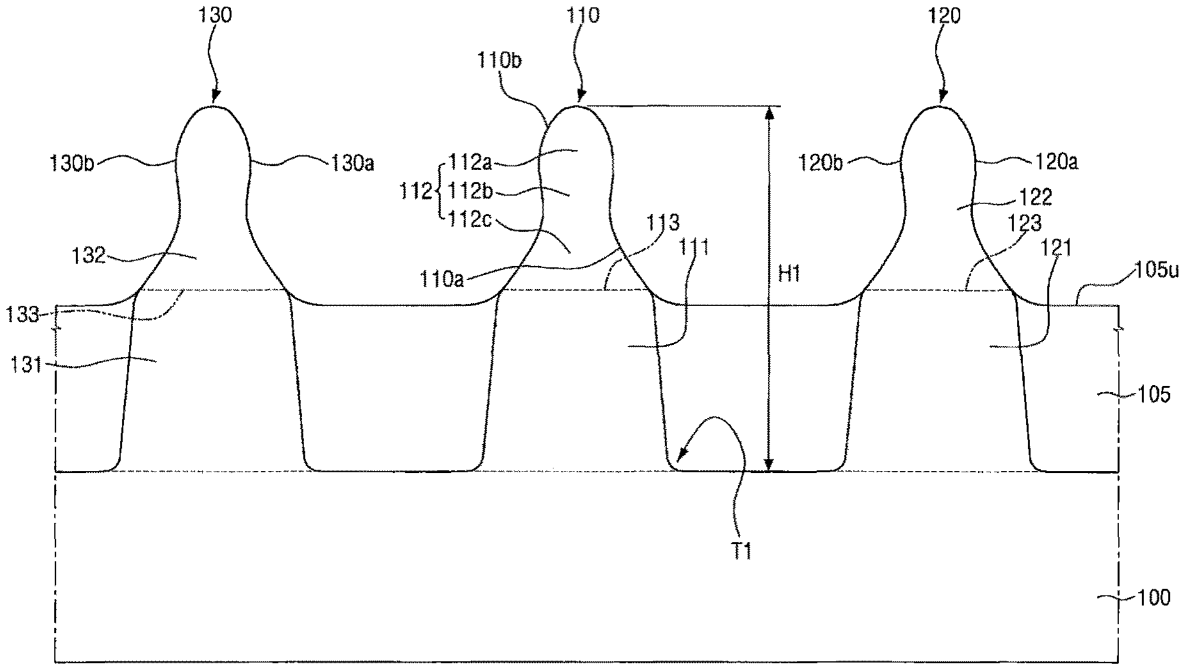
FIG. 10 is a cross sectional view taken on line B-B of FIG. 9.

FIG. 9 is a layout diagram provided to explain a semiconductor device according to some exemplary embodiments. FIG. 10 is a cross sectional view taken on line B-B of FIG. 9.

For reference, FIG. 10 omits illustration of the first gate electrode for convenience of explanation.

Referring to FIGS. 9 and 10, a semiconductor device according to some exemplary embodiments may additionally include a second fin-type pattern 120 and a third fin-type pattern 130 disposed on both sides of the first fin-type pattern 110 while being intervened by the first fin-type pattern 110.

The second fin-type pattern 120 and the third fin-type pattern 130 may each extend longitudinally in the first direction X1.

The first fin-type pattern 110, the second fin-type pattern 120, and the third fin-type pattern 130 may be defined by a first trench T1 of a first depth H1 relative to an uppermost surface of each of the fin-type patterns.

Between the first fin-type pattern 110 and the second fin-type pattern 120, a trench having a deeper depth than the first trench T1 of the first depth H1 may not be formed. Likewise, between the first fin-type pattern 110 and the third fin-type pattern 130, a trench having a deeper depth than the first trench T1 of the first depth H1 may not be formed.

The distance D1 between the first fin-type pattern 110 and the second fin-type pattern 120 may be same as, or different from the distance D2 between the first fin-type pattern 110 and the third fin-type pattern 130.

The second fin-type pattern 120 may include a first sidewall 120*a* and a second sidewall 120*b* facing away from each other. The third fin-type pattern 130 may include a first sidewall 130*a* and a second sidewall 130*b* facing away from each other.

The field insulating film 105 may fill a portion of the first trench T1 between the first fin-type pattern 110 and the second fin-type pattern 120, and a portion of the first trench T1 between the first fin-type pattern 110 and the third fin-type pattern 130.

The field insulating film 105 may surround a portion of the first sidewall 120*a* of the second fin-type pattern 120 and a portion of the second sidewall 120*b* of the second fin-type pattern 120, and a portion of the first sidewall 130*a* of the third fin-type pattern 130 and a portion of the second sidewall 130*b* of the third fin-type pattern 130.

The second fin-type pattern 120 may include an upper portion 122 and a lower portion 121. The second fin-type pattern 120 may include a second boundary line 123 between the upper portion 122 of the second fin-type pattern 120 and the lower portion 121 of the second fin-type pattern 120.

The third fin-type pattern 130 may include an upper portion 132 and a lower portion 131. The third fin-type pattern 130 may include a third boundary line 133 between the upper portion 132 of the third fin-type pattern 130 and the lower portion 131 of the third fin-type pattern 130.

The field insulating film 105 may surround the lower portion 121 of the second fin-type pattern 120 and the lower portion 131 of the third fin-type pattern 130. However, the field insulating film 105 does not surround the first sidewall 120*a* and the second sidewall 120*b* of the upper portion 122 of the second fin-type pattern 120, and the first sidewall 130*a* and the second sidewall 130*b* of the upper portion 132 of the third fin-type pattern 130.

The first fin-type pattern 110 may include the third portion 112*c* of the first fin-type pattern 110, the second portion 112*b* of the first fin-type pattern 110, and the first portion 112*a* of the first fin-type pattern 110, positioned in a sequential order on the upper surface of the substrate 100.

Beyond the upper surface 105*u* of the field insulating film, the width of the first fin-type pattern 110 may decrease, increase, and then decrease again.

Further, beyond the upper surface 105*u* of the field insulating film, the first sidewall 110*a* of the first fin-type pattern 110 and the second sidewall 110*b* of the first fin-type pattern 110 may each have a slope at an acute angle, then a slope at an obtuse angle, and then a slope at an acute angle again relative to the first boundary line 113.

Like the first sidewall 110*a* of the first fin-type pattern 110, beyond the upper surface 105*u* of the field insulating film, the second sidewall 120*b* of the second fin-type pattern 120 that faces the first sidewall 110*a* of the first fin-type pattern 110 may have a slope at an acute angle, then a slope at an obtuse angle, and then a slope at an acute angle again relative to the second boundary line 123.

Like the second sidewall 110*b* of the first fin-type pattern 110, beyond the upper surface 105*u* of the field insulating film, the first sidewall 130*a* of the third fin-type pattern 130 that faces the second sidewall 110*b* of the first fin-type pattern 110 may have a slope at an acute angle, then a slope at an obtuse angle, and then a slope at an acute angle again relative to the third boundary line 133.

In other words, beyond the upper surface 105*u* of the field insulating film, the first sidewall 110*a* of the first fin-type pattern 110 and the second sidewall 120*b* of the second fin-type pattern 120 facing each other may have similar patterns of slope variation.

Likewise, beyond the upper surface 105*u* of the field insulating film, the second sidewall 110*b* of the first fin-type pattern 110 and the first sidewall 130*a* of the third fin-type pattern 130 facing each other may have similar patterns of slope variation.

As illustrated in FIG. 10, beyond the upper surface 105*u* of the field insulating film, the first sidewall 120*a* of the second fin-type pattern 120 and the second sidewall 130*b* of the third fin-type pattern 130 may each have a slope at an acute angle, then a slope at an obtuse angle, and then a slope at an acute angle again, but this is provided only for convenience of explanation and the exemplary embodiments are not limited thereto.

Accordingly, for example, depending on a distance between the second fin-type pattern 120 and the fin-type pattern adjacent to the first sidewall 120*a* of the second fin-type pattern 120, and so on, the slope variation of the first sidewall 120*a* of the second fin-type pattern 120 may vary from the slope variation of the second sidewall 120*b* of the second fin-type pattern 120.

The first gate electrode 210 is illustrated as intersecting all of the first to third fin-type patterns 110, 120, 130, but this is provided only for convenience of explanation and exemplary embodiments are not limited thereto.

Accordingly, the first gate electrode 210 may intersect some of the first to third fin-type patterns 110, 120, 130, including the first fin-type pattern 110.

Figure 11:
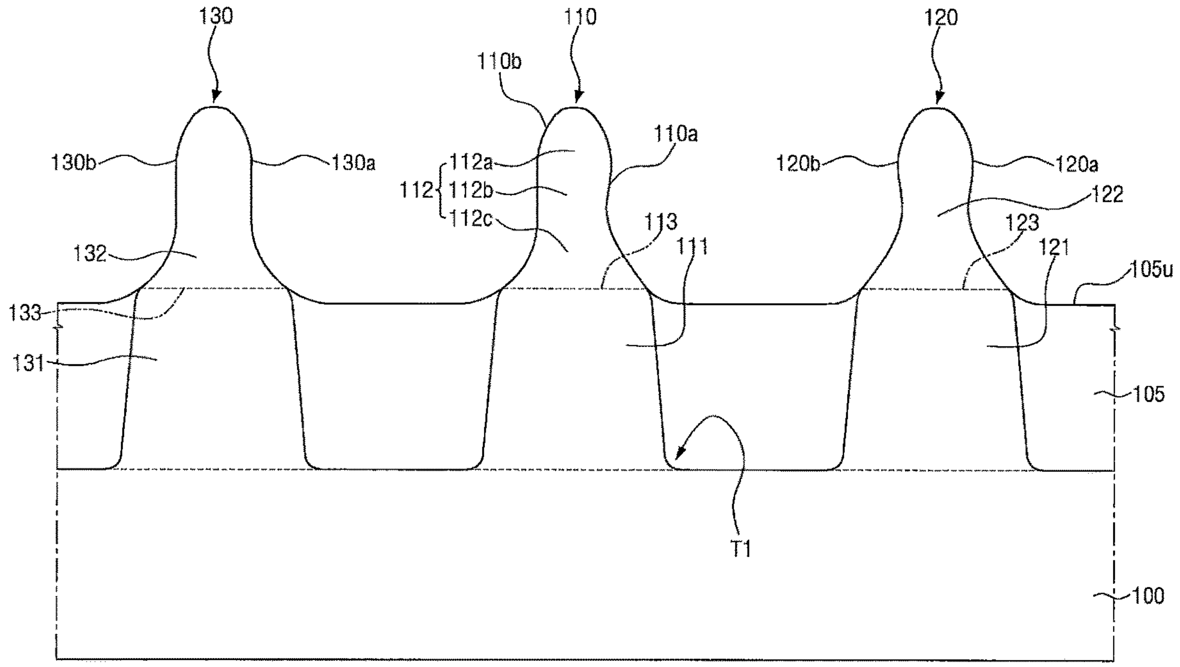
FIG. 11 is a view provided to explain a semiconductor device according to exemplary embodiments.

FIG. 11 is a view provided to explain a semiconductor device according to some exemplary embodiments.

Referring to FIG. 11, in the semiconductor device according to some exemplary embodiments, the distance D1 between the first fin-type pattern 110 and the second fin-type pattern 120 may be different from the distance D2 between the first fin-type pattern 110 and the third fin-type pattern 130.

The first fin-type pattern 110 is substantially similar to that disclosed in reference to FIGS. 6 and 7.

Beyond the upper surface 105*u* of the field insulating film, the first sidewall 110*a* of the first fin-type pattern 110 may have a slope at an acute angle, then a slope at an obtuse angle, and then a slope at an acute angle again.

However, beyond the upper surface 105*u* of the field insulating film, the second sidewall 110*b* of the first fin-type pattern 110 may have a slope at an acute angle or a slope at a right angle.

Accordingly, the slope variation of the second sidewall 110*b* of the upper portion 112 may be different from the slope variation of the first sidewall 110*a* of the upper portion 112 of the first fin-type pattern 110.

Like the first sidewall 110*a* of the first fin-type pattern 110, beyond the upper surface 105*u* of the field insulating film, the second sidewall 120*b* of the second fin-type pattern 120 that faces the first sidewall 110*a* of the first fin-type pattern 110 may have a slope at an acute angle, then a slope at an obtuse angle, and then a slope at an acute angle again.

Like the second sidewall 110*b* of the first fin-type pattern 110, beyond the upper surface 105*u* of the field insulating film, the first sidewall 130*a* of the third fin-type pattern 130 that faces the second sidewall 110*b* of the first fin-type pattern 110 may have a slope at an acute angle, or a slope at a right angle.

As illustrated in FIG. 10, beyond the upper surface 105*u* of the field insulating film, the second sidewall 130*b* of the third fin-type pattern 130 may have a slope at an acute angle or a slope at a right angle.

For example, when the distance between the third fin-type pattern 130 and the fin-type pattern adjacent to the second sidewall 130*b* of the third fin-type pattern 130 is as far as D2, beyond the upper surface 105*u* of the field insulating film, the second sidewall 130*b* of the third fin-type pattern 130 may have a slope at an acute angle or a slope at a right angle.

That is, the width of the third fin-type pattern 130 may decrease as the distance from the upper surface 105*u* of the field insulating film increases.

Unlike the embodiment described above, when the distance between the third fin-type pattern 130 and the fin-type pattern adjacent to the second sidewall 130*b* of the third fin-type pattern 130 is different from D2, beyond the upper surface 105*u* of the field insulating film, the second sidewall 130*b* of the third fin-type pattern 130 may have a slope at an acute angle, then a slope at an obtuse angle, and then a slope at an acute angle again.

Figure 12:
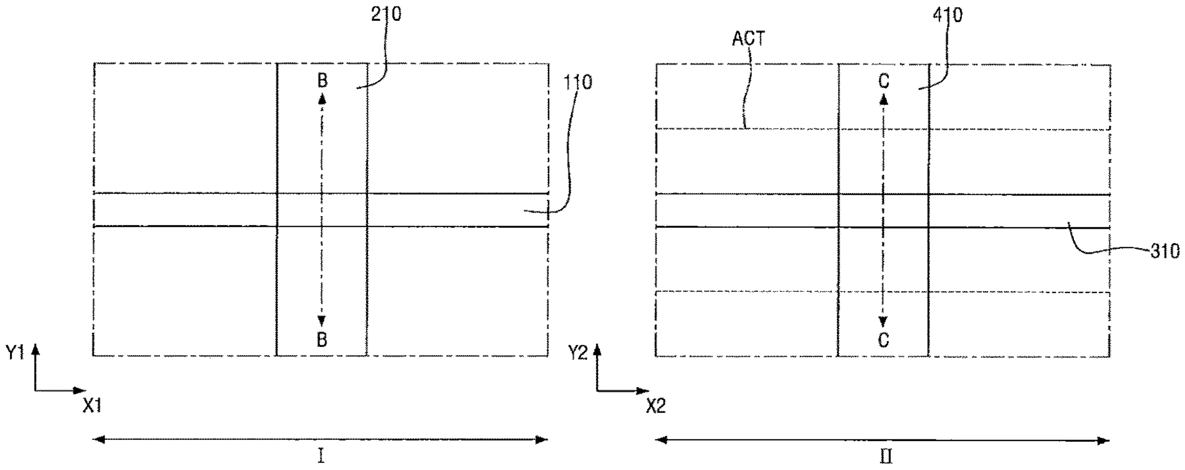
FIG. 12 is a layout diagram provided to explain a semiconductor device according to exemplary embodiments.
Figure 13:
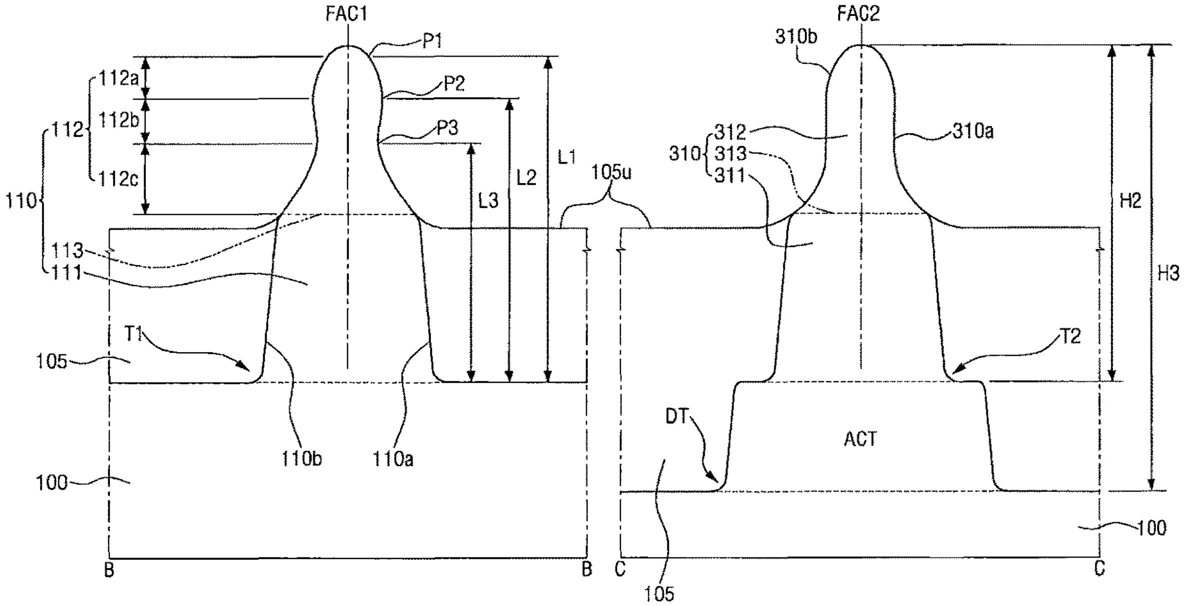
FIG. 13 is a cross sectional view taken on lines B-B and C-C of FIG. 12.

FIG. 12 is a layout diagram provided to explain a semiconductor device according to some exemplary embodiments. FIG. 13 is a cross sectional view taken on lines B-B and C-C of FIG. 12.

The embodiments of the layout diagram of the first region in FIG. 12, and the cross sectional view of FIG. 13 taken on line B-B of FIG. 12 are substantially similar to those described above with reference to FIGS. 1 and 3 to 5.

The cross sectional view of FIG. 13 taken on line B-B of FIG. 12 may be illustrated similarly as FIGS. 4 and 5, but not limited thereto. Accordingly, in some embodiments the cross sectional view of FIG. 13 taken on line B-B of FIG. 12 may be similar to FIGS. 6 and 7, or as FIG. 8.

For reference, FIG. 13 omits illustration of the first gate electrode and the second gate electrode for convenience of explanation.

Referring to FIGS. 12 and 13, a semiconductor device according to some exemplary embodiments may include a first fin-type pattern 110, a fourth fin-type pattern 310, a first gate electrode 210, and a second gate electrode 410.

The substrate 100 may include a first region I and a second region II. For example, the first region I of the substrate 100 may be a SRAM region, and the second region II of the substrate 100 may be a logic region.

The first fin-type pattern 110 and the first gate electrode 210 may be formed in the first region I of the substrate 100.

The first fin-type pattern 110 may be defined by the first trench T1. In the first region I where the first fin-type pattern 110 is positioned, a trench having a deeper depth than the first trench T1 may not be formed.

The fourth fin-type pattern 310 and the second gate electrode 410 may be formed in the second region II of the substrate 100.

The fourth fin-type pattern 310 may be formed in the active region ACT of the second region II. The fourth fin-type pattern 310 may extend longitudinally on the substrate 100, in a third direction X2. The fourth fin-type pattern 310 may protrude from the active region ACT.

The fourth fin-type pattern 310 may be defined by a second trench T2 of a second depth H2. Further, the active region ACT may be defined by a deep trench DT of a third depth H3 deeper than the second depth H2.

The fourth fin-type pattern 310 may include a first sidewall 310*a* and a second sidewall 310*b* facing away from each other. The first sidewall 310*a* of the fourth fin-type pattern 310 and the second sidewall 310*b* of the fourth fin-type pattern 310 may be the sidewalls extending in the third direction X2.

The field insulating layer 105 may fill a portion of the second trench T2 and a portion of the deep trench DT.

The field insulating film 105 may be formed so as to surround a portion of the fourth fin-type pattern 310. The fourth fin-type pattern 310 may be defined by the field insulating film 105. A portion of the fourth fin-type pattern 310 may protrude upward beyond the upper surface 105*u* of the field insulating film.

The field insulating film 105 may surround a portion of the first sidewall 310*a* of the fourth fin-type pattern 310, and a portion of the second sidewall 310*b* of the fourth fin-type pattern 310.

The fourth fin-type pattern 310 may include an upper portion 312 and a lower portion 311. The fourth fin-type pattern 310 may include a fourth boundary line 313 between the upper portion 312 of the fourth fin-type pattern 310 and the lower portion 311 of the fourth fin-type pattern 310.

The field insulating film 105 may surround the lower portion 311 of the fourth fin-type pattern 310. However, the field insulating film 105 does not surround the first sidewall 310*a* and the second sidewall 310*b* of the upper portion 312 of the fourth fin-type pattern 310.

That is, the upper portion 312 of the fourth fin-type pattern 310 may be the portion that protrudes upward beyond the upper surface 105*u* of the field insulating film.

The fourth boundary line 313 may be a boundary between the lower portion 311 of the fourth fin-type pattern 310 surrounded by the field insulating film 105, and the upper portion 312 of the fourth fin-type pattern 310 opposed by the field insulating film 105. When the field insulating film 105 is in contact with the fourth fin-type pattern 310, the fourth boundary line 313 may be a line that connects points where an upper surface of the field insulating film 105 meets the first sidewall 310*a* and the second sidewall 310*b*.

Further, the fourth fin-type pattern 310 may include a second fin center line FAC2 that is orthogonal to the fourth boundary line 313 and meets an uppermost portion of the fourth fin-type pattern 310. That is, the second fin center line FAC2 may meet the uppermost portion of the upper portion 312 of the fourth fin-type pattern 310.

The upper portion 312 of the fourth fin-type pattern 310 and the lower portion 311 of the fourth fin-type pattern 310 may include the same material. Further, the fourth fin-type pattern 310 may include a material that is the same as the first fin-type pattern 110.

In the semiconductor device according to some exemplary embodiments, the first fin-type pattern 110 and the fourth fin-type pattern 310 may be the silicon fin-type patterns each including silicon.

The second gate electrode 410 may be formed to extend in the fourth direction Y2, thus intersecting the fourth fin-type pattern 310.

The second gate electrode 410 may be substantially similar to that of the first gate electrode 210.

Beyond the upper surface 105*u* of the field insulating film, the first sidewall 310*a* of the fourth fin-type pattern 310 and the second sidewall 310*b* of the fourth fin-type pattern 310 may each have a slope at an acute angle or a slope at a right angle, as the distance from the upper surface of the substrate 100 increases relative to the fourth boundary line 313.

In other words, beyond the upper surface 105*u* of the field insulating film, the width of the fourth fin-type pattern 310 may decrease as the distance from the upper surface of the substrate 100 increases.

Figure 14:
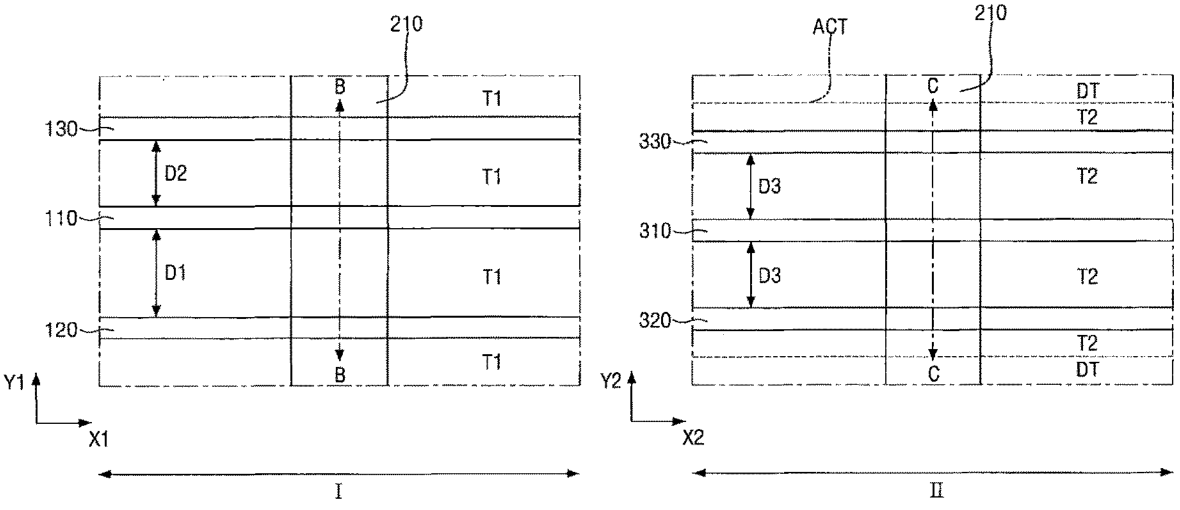
FIG. 14 is a layout diagram provided to explain a semiconductor device according to exemplary embodiments.

FIG. 14 is a layout diagram provided to explain a semiconductor device according to some exemplary embodiments.

For reference, a cross sectional view taken on line B-B of FIG. 14 may be substantially similar to FIG. 10 or FIG. 11. Accordingly, the first to third fin-type patterns 110, 120, 130 are substantially similar to the description provided above with reference to FIG. 10 or FIG. 11.

Referring to FIG. 14, a semiconductor device according to some exemplary embodiments may additionally include a second fin-type pattern 120, a third fin-type pattern 130, a fifth fin-type pattern 320, and a sixth fin-type pattern 330.

The second fin-type pattern 120 and the third fin-type pattern 130 may be formed in the first region I of the substrate 100, and the fifth fin-type pattern 320 and the sixth fin-type pattern 330 may be formed in the second region II of the substrate 100.

The second fin-type pattern 120 and the third fin-type pattern 130 may be disposed on both sides of the first fin-type pattern 110 having the first fin-type pattern 110 therebetween.

The fifth fin-type pattern 320 and the sixth fin-type pattern 330 may be disposed on both sides of the fourth fin-type pattern 310 having the fourth fin-type pattern 310 therebetween.

The distance D3 between the fourth fin-type pattern 310 and the fifth fin-type pattern 320 may be same as the distance D3 between the fourth fin-type pattern 310 and the sixth fin-type pattern 330.

The fourth to sixth fin-type patterns 310, 320, 330 may be defined by the second trench T2. Further, the fourth to sixth fin-type patterns 310, 320, 330 may be formed on the active region ACT defined by the deep trench DT.

However, a trench deeper than the second trench T2 may not be formed between the fourth fin-type pattern 310 and the fifth fin-type pattern 320, and between the fourth fin-type pattern 310 and the sixth fin-type pattern 330.

The fourth to sixth fin-type patterns 310, 320, 330 formed on the active region ACT may be formed at same interval.

Referring to the cross sectional view taken on line C-C of FIG. 14, the cross sections of the fifth fin-type pattern 320 and the sixth fin-type pattern 330 may each be substantially same as the cross section of the fourth fin-type pattern 310 in FIG. 13.

In a semiconductor device according to some exemplary embodiments, the distance D1 between the first fin-type pattern 110 and the second fin-type pattern 120 may be different from the distance D2 between the first fin-type pattern 110 and the third fin-type pattern 130. For example, the distance D1 between the first fin-type pattern 110 and the second fin-type pattern 120 may be greater than the distance D2 between the first fin-type pattern 110 and the third fin-type pattern 130.

That is, in the first region I, the first to third fin-type patterns 110, 120, 130 may be spaced apart from one another at different distances may be formed.

Further, the distance D1 between the first fin-type pattern 110 and the second fin-type pattern 120 may be different from the distance D3 between the fourth fin-type pattern 310 and the fifth fin-type pattern 320.

FIG. 14 illustrates three fin-type patterns formed in the active region ACT of the second region II, but this is only for convenience of explanation and the exemplary embodiments are not limited thereto. That is, there may be two fin-type patterns or four or more fin-type patterns formed in the active region ACT of the second region II.

Figure 15:
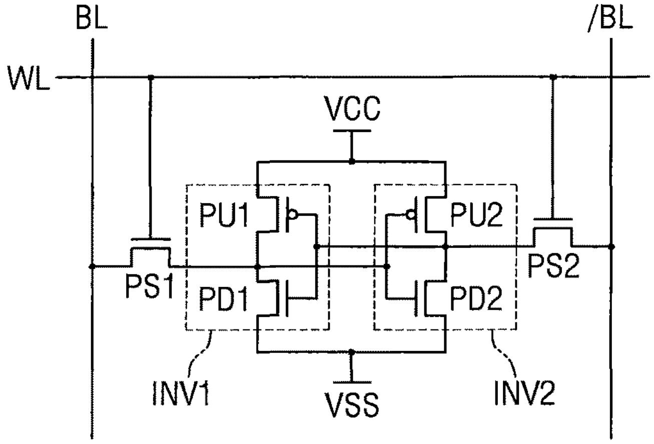
FIG. 15 is a circuit diagram provided to explain a semiconductor device according to exemplary embodiments.
Figure 16:
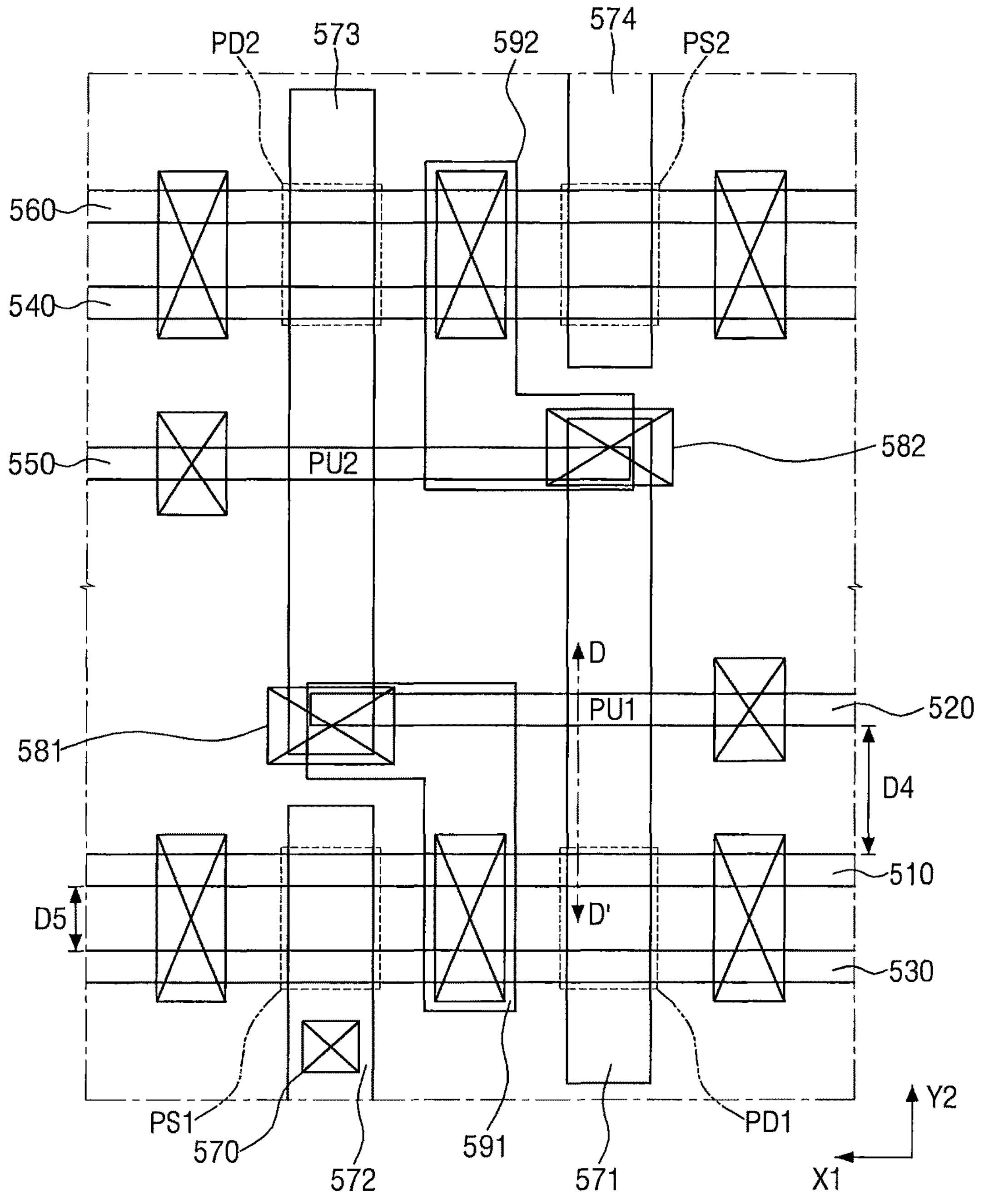
FIG. 16 is a layout diagram of the semiconductor device of FIG. 15.
Figure 17:
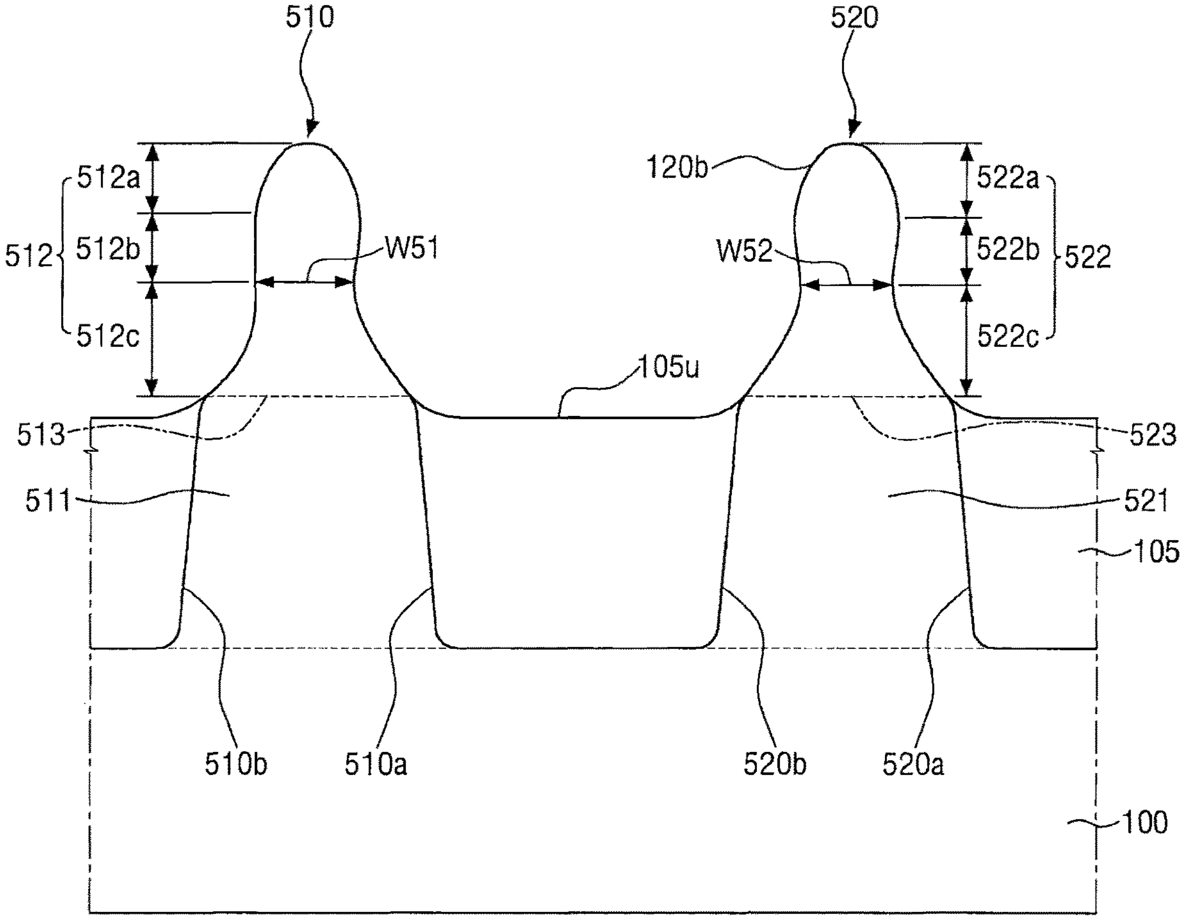
FIG. 17 is a cross sectional view taken on line D-D of FIG. 16.

FIG. 15 is a circuit diagram provided to explain a semiconductor device according to some exemplary embodiments. FIG. 16 is a layout diagram of the semiconductor device of FIG. 15. FIG. 17 is a cross sectional view taken on line D-D of FIG. 16.

For reference, FIG. 17 illustrates fin-type patterns, while omitting gate electrodes, and so on.

Referring to FIG. 15, a semiconductor device may include a pair of inverters INV1, INV2 connected in parallel between a power node Vcc and a ground node Vss, and a first pass transistor PS1 and a second pass transistor PS2 connected to output nodes of the respective inverters INV1, INV2. The first pass transistor PS1 and the second pass transistor PS2 may each be connected to a bit line BL and a complementary bit line/BL, respectively. The gates of the first pass transistor PS1 and the second pass transistor PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 are PFET transistors, and the first pull-down transistor PD1 and the second pull-down transistor PD2 may be NFET transistors.

Further, in order for the first inverter INV1 and the second inverter INV2 to construct one latch circuit, the input node of the first inverter INV1 is connected to the output node of the second inverter INV2, and the input node of the second inverter INV2 is connected to the output node of the first inverter INV1.

In this case, referring to FIGS. 15 and 16, each of the seventh fin-type pattern 510, the eighth fin-type pattern 520, the ninth fin-type pattern 530, the tenth fin-type pattern 540, the eleventh fin-type pattern 550 and the twelfth fin-type pattern 560, being spaced from one another, is so formed as to extend longitudinally in the first direction X1. The eighth fin-type pattern 520 and the eleventh fin-type pattern 550 may extend a shorter length than the seventh fin-type pattern 510, the ninth fin-type pattern 530, the tenth fin-type pattern 540, and the twelfth fin-type pattern 560.

Further, a first gate line 571, a second gate line 572, a third gate line 573, and a fourth gate line 574 are formed so as to extend longitudinally in the second direction Y2 and intersect the seventh to twelfth fin-type patterns 510-560.

Specifically, the first gate line 571 may entirely intersect the seventh to ninth fin-type patterns 510, 520, 530, and be partially overlapped with an end of the eleventh fin-type pattern 550. The third gate line 573 may entirely intersect the tenth to twelfth fin-type patterns 540, 550, 560, and be partially overlapped with an end of the eighth fin-type pattern 520. The second gate line 572 is so formed as to intersect the seventh fin-type pattern 510 and the ninth fin-type pattern 530, and the fourth gate line 574 is so formed as to intersect the tenth fin-type pattern 540 and the twelfth fin-type pattern 560.

As illustrated, a first pull-up transistor PU1 is defined near an intersecting region between the first gate line 571 and the eighth fin-type pattern 520, a first pull-down transistor PD1 is defined near an intersecting region between the first gate line 571 and the seventh fin-type pattern 510 and the ninth fin-type pattern 530, and a first pass transistor PS1 is defined near an intersecting region between the second gate line 572 and the seventh fin-type pattern 510 and the ninth fin-type pattern 530.

A second pull-up transistor PU2 is defined near an intersecting region between the third gate line 573 and the eleventh fin-type pattern 550, a second pull-down transistor PD2 is defined near an intersecting region between the third gate line 573 and the tenth fin-type pattern 540 and the twelfth fin-type pattern 560, and a second pass transistor PS2 is defined near an intersecting region between the fourth gate line 574 and the tenth fin-type pattern 540 and the twelfth fin-type pattern 560.

The source/drain may be formed on both sides of the intersecting regions between the first to fourth gate lines 571-574 and the seventh to twelfth fin-type patterns 510, 520, 530, 540, 550, 560 and a plurality of contacts 570 may be formed.

Furthermore, a first shared contact 581 concurrently connects the eighth fin-type pattern 520, the third gate line 573 and a wire 591. A second shared contact 582 concurrently connects the eleventh fin-type pattern 550, the first gate line 571 and a wire 592.

At least one of the semiconductor devices of the exemplary embodiments described above with reference to FIGS. 1 to 11 may be employed in such SRAM layout.

More specifically, referring to FIGS. 16 and 17, the seventh fin-type pattern 510 and the eighth fin-type pattern 520 may be formed adjacent to each other.

A distance D4 between the seventh fin-type pattern 510 and the eighth fin-type pattern 520 may be different from a distance D5 between the seventh fin-type pattern 510 and the ninth fin-type pattern 530. For example, the distance D4 between the seventh fin-type pattern 510 and the eighth fin-type pattern 520 may be greater than the distance D5 between the seventh fin-type pattern 510 and the ninth fin-type pattern 530.

Further, the distance between the eighth fin-type pattern 520 and the eleventh fin-type pattern 550 may be substantially same as the distance D4 between the seventh fin-type pattern 510 and the eighth fin-type pattern 520.

The seventh fin-type pattern 510 may be used as a channel region of the first pull-down transistor PD1 which is NFET, and the eighth fin-type pattern 520 may be used as a channel region of the first pull-up transistor PU1 which is PFET.

That is, the seventh fin-type pattern 510 and the eighth fin-type pattern 520 may be used as the channel regions of different types of transistors.

The seventh fin-type pattern 510 may include an upper portion 512, a lower portion 511, and a fifth boundary line 513 between the upper portion 512 and the lower portion 511. The seventh fin-type pattern 510 may include a first sidewall 510*a* and a second sidewall 510*b* facing away from each other.

The eighth fin-type pattern 520 may include an upper portion 522, a lower portion 521, and a sixth boundary line 523 between the upper portion 522 and the lower portion 521. The eighth fin-type pattern 520 may include a first sidewall 520*a* and a second sidewall 520*b* facing away from each other.

The field insulating film 105 may surround a portion of the sidewalls 510*a*, 510*b* of the seventh fin-type pattern 510, and a portion of the sidewalls 520*a*, 520*b* of the eighth fin-type pattern 520. The field insulating film 105 may surround the lower portion 511 of the seventh fin-type pattern 510 and the lower portion 521 of the eighth fin-type pattern 520. The upper portion 512 of the seventh fin-type pattern 510 and the upper portion 522 of the eighth fin-type pattern 520 may protrude upward beyond the upper surface 105*u* of the field insulating film.

On the field insulating film 105, the first gate line 571 may intersect the seventh fin-type pattern 510 and the eighth fin-type pattern 520.

The seventh fin-type pattern 510 may include a third portion 512*c*, a second portion 512*b*, and a first portion 512*a* positioned in a sequential order from the upper surface of the substrate 100. The third portion 512*c* of the seventh fin-type pattern 510 may be included in the upper portion 512 of the seventh fin-type pattern 510.

The eighth fin-type pattern 520 may include a third portion 522*c*, a second portion 522*b*, and a first portion 522*a* positioned in a sequential order from the upper surface of the substrate 100. The third portion 522*c* of the eighth fin-type pattern 520 may be included in the upper portion 522 of the eighth fin-type pattern 520.

As the distance from the upper surface of the substrate 100 increases, the width of the third portion 512*c* of the seventh fin-type pattern 510, the width of the first portion 512*a* of the seventh fin-type pattern 510, the width of the third portion 522*c* of the eighth fin-type pattern 520, and the width of the first portion 522*a* of the eighth fin-type pattern 520 may decrease, respectively.

In contrast, as the distance from the upper surface of the substrate 100 increases, the width of the second portion 512*b* of the seventh fin-type pattern 510, and the width of the second portion 522*b* of the eighth fin-type pattern 520 may each increase.

In this case, the width W51 of the seventh fin-type pattern 510 at a boundary between the third portion 512*c* of the seventh fin-type pattern 510 and the second portion 512*b* of the seventh fin-type pattern 510 may be different from the width W52 of the eighth fin-type pattern 520 at a boundary between the third portion 522*c* of the eighth fin-type pattern 520 and the second portion 522*b* of the eighth fin-type pattern 520.

For example, the width W51 of the seventh fin-type pattern 510 at a boundary between the third portion 512*c* of the seventh fin-type pattern 510 and the second portion 512*b* of the seventh fin-type pattern 510 may be greater than the width W52 of the eighth fin-type pattern 520 at a boundary between the third portion 522*c* of the eighth fin-type pattern 520 and the second portion 522*b* of the eighth fin-type pattern 520.

For example, beyond the upper surface 105*u* of the field insulating film, the first sidewall 510*a* of the seventh fin-type pattern 510, the first sidewall 520*a* of the eighth fin-type pattern 520, and the second sidewall 520*b* of the eighth fin-type pattern 520 may each have a slope at an acute angle, then a slope at an obtuse angle, and then a slope at an acute angle again.

In contrast, beyond the upper surface 105*u* of the field insulating film, the second sidewall 510*b* of the seventh fin-type pattern 510 may have a slope at an acute angle or a slope at an obtuse angle, but not limited thereto.

FIGS. 18 to 23 are views illustrating intermediate stages of fabrication, provided to explain a fabricating method of a semiconductor device according to some exemplary embodiments.

Figure 18:
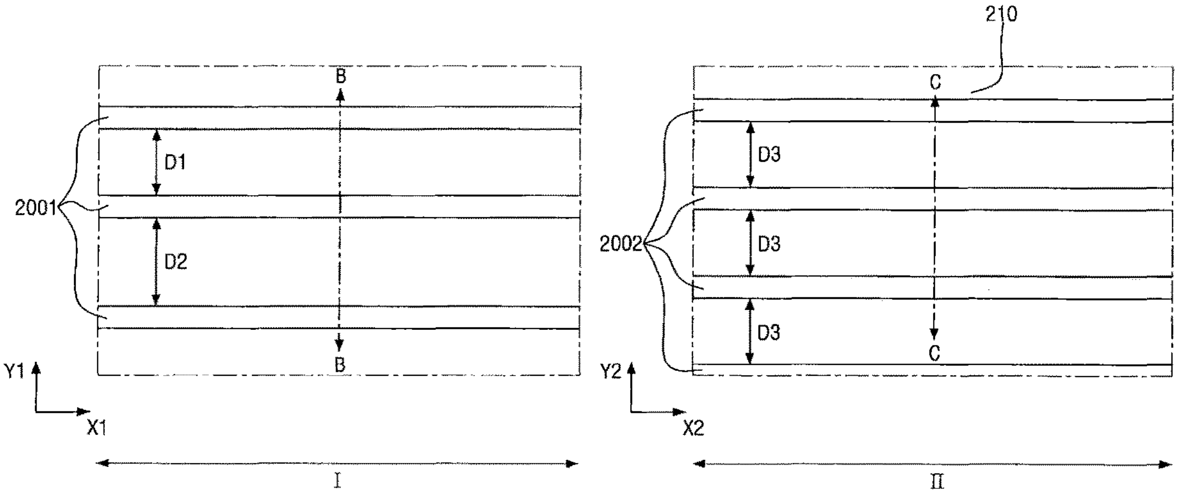
FIGS. 18 to 23 are views illustrating intermediate stages of fabrication, provided to explain a method of forming a semiconductor device according to exemplary embodiments.
Figure 19:
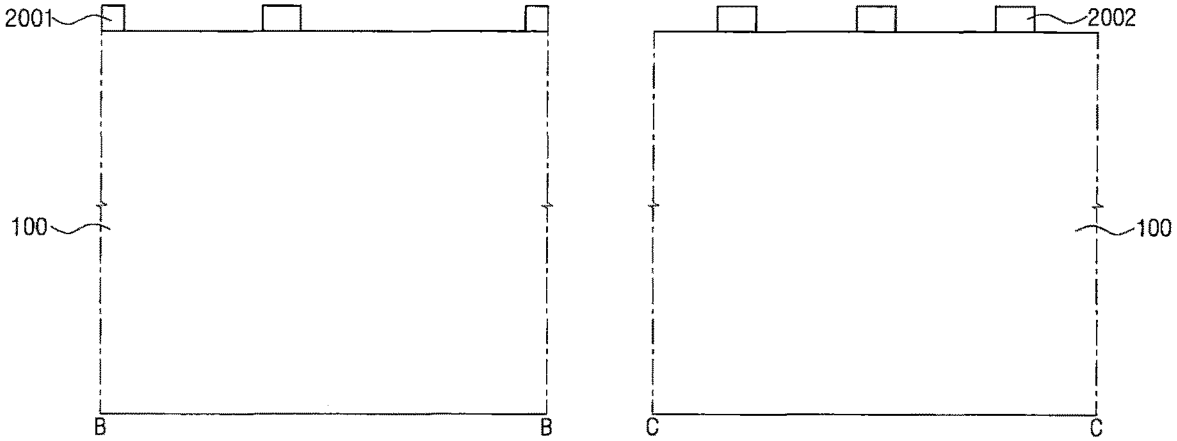

For reference, FIG. 19 shows cross sectional views taken on lines B-B and C-C of FIG. 18.

Referring to FIGS. 18 and 19, a first mask pattern 2001 may be formed in the first region I on the substrate 100, and a second mask pattern 2002 may be formed in the second region II on the substrate 100.

The first mask pattern 2001 may be formed at various intervals. For example, the interval between the first mask pattern 2001 may be D1 or D2.

However, the second mask pattern 2002 may be formed at regular intervals. For example, the interval between the second mask pattern 2002 may be D3.

In this case, the interval D3 between the second mask pattern 2002 may be different from the interval D1, D2 between the first mask pattern 2001.

Figure 20:
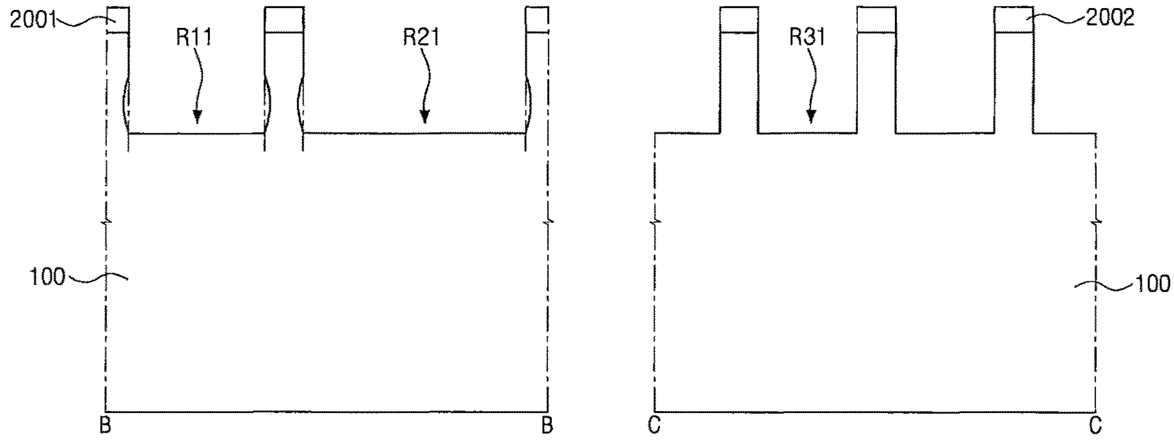

Referring to FIG. 20, a portion of the substrate 100 may be removed by using the first mask pattern 2001 as a mask. By doing so, a first recess R11 and a second recess R21 may be formed within the substrate 100.

Further, a portion of the substrate 100 may be removed by using the second mask pattern 2002 as a mask. By doing so, a third recess R31 may be formed within the substrate 100.

Removing the portion of the substrate 100 by using the first mask pattern 2001 and the second mask pattern 2002 may include, for example, etch process, oxidation process, and an oxide removing process.

The etch process may include removing a portion of the substrate 100 by using an etchant. The etch process may include oxidizing surfaces of the recess R11, R12, R31 of the substrate 100 that are formed by etch process. Further, the oxide removing process may include removing the oxides formed on the surfaces of the recesses R11, R21, R31.

At this time, the interval D1 of the first mask pattern 2001 used for the formation of the first recess R11, and the interval D2 of the first mask pattern 2001 used for the formation of the second recess R21 are different from the interval D3 of the second mask pattern 2002 used for the formation of the third recess R31.

Because the intervals D1, D2 of the first mask pattern 2001 are different from the interval D3 of the second mask pattern 2002, the loading effect occurs during etch process of removing a portion of the substrate 100.

In other words, the shapes of the first recess R11 and the second recess R21, and the shape of the third recess R31 may be different from one another.

It is assumed herein that the process variables of the etch process are optimized for the purpose of forming the third recess R31 by using the second mask pattern 2002.

In this case, the sidewall of the third recess R31 formed by using the second mask pattern 2002 may be, for example, a plane. However, unlike the sidewall of the third recess R31, the sidewall of the first recess R11 and the second recess R21 formed by using the first mask pattern 2001 may be curved surfaces due to the loading effect.

The degree with which the sidewall of the first recess R11 and the sidewall of the second recess R21 bend may vary according to interval between the first mask pattern 2001.

Figure 21:
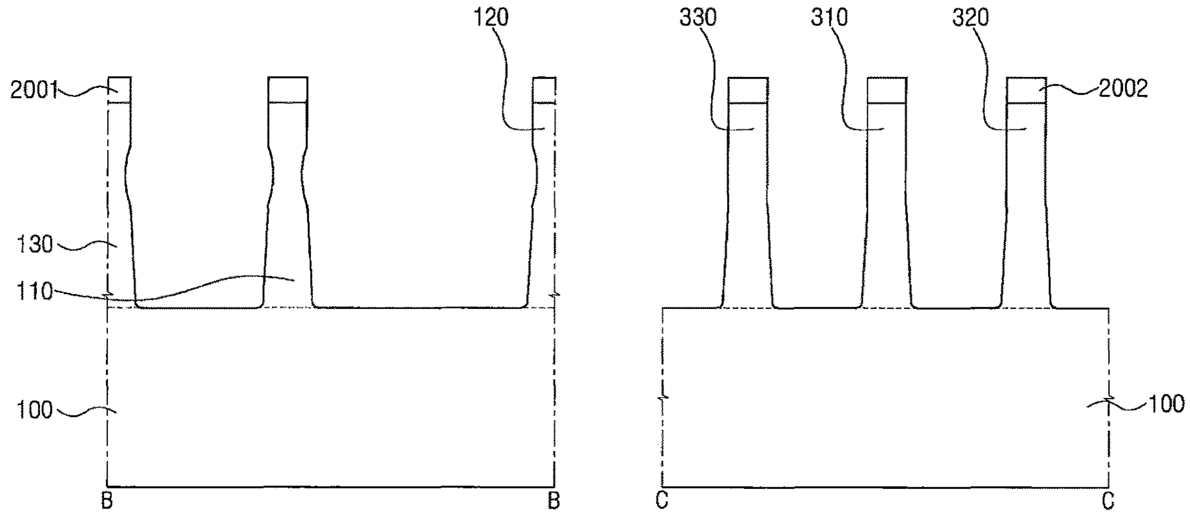

Referring to FIG. 21, the substrate 100 with the first to third recesses R11, R21, R31 formed therein may be etched again, by using the first mask pattern 2001 and the second mask pattern 2002.

By doing so, the first to sixth fin-type patterns 110, 120, 130, 310, 320, 330 may be formed on the substrate 100.

The trace of the first recess R11 and the second recess R21 may remain on the sidewalls of the first to third fin-type patterns 110, 120, 130.

Figure 22:
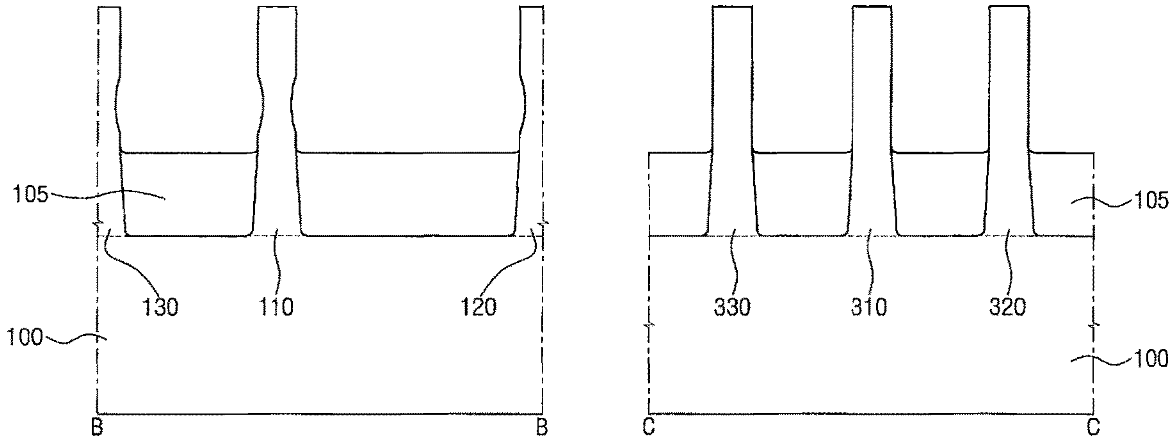

Referring to FIG. 22, the field insulating film 105 may be formed on the substrate 100, covering a portion of the first to sixth fin-type patterns 110, 120, 130, 310, 320, 330.

The first mask pattern 2001 and the second mask pattern 2002 on the first to sixth fin-type patterns 110, 120, 130, 310, 320, 330 may also be removed.

Figure 23:
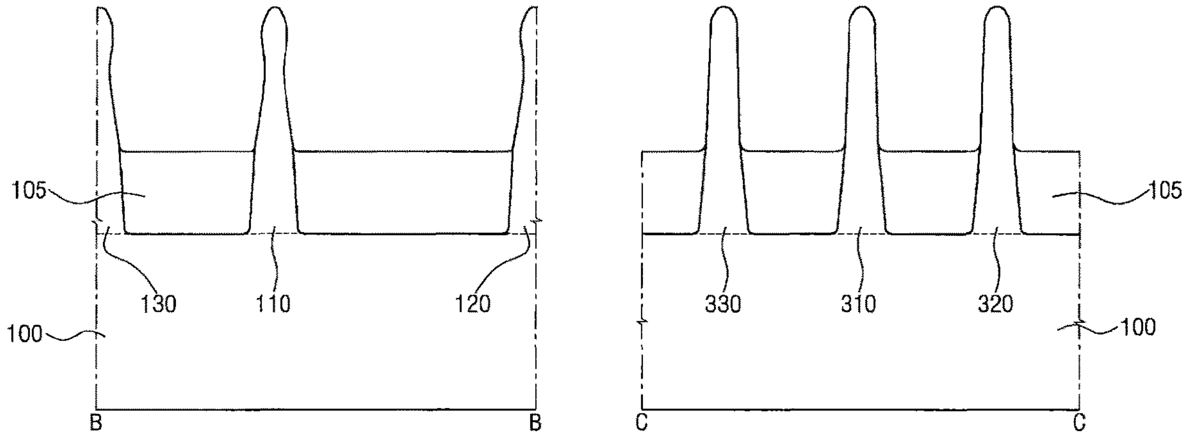

Referring to FIG. 23, it is possible to adjust the profile of the sidewalls of the first to third fin-type patterns 110, 120, 130 and the profile of the sidewalls of the fourth to sixth fin-type patterns 310, 320, 330, by conducting the oxidation process and the oxide removing process.

After that, gate electrodes, and so on may be formed across the first to sixth fin-type patterns 110, 120, 130, 310, 320, 330.

Figure 24:
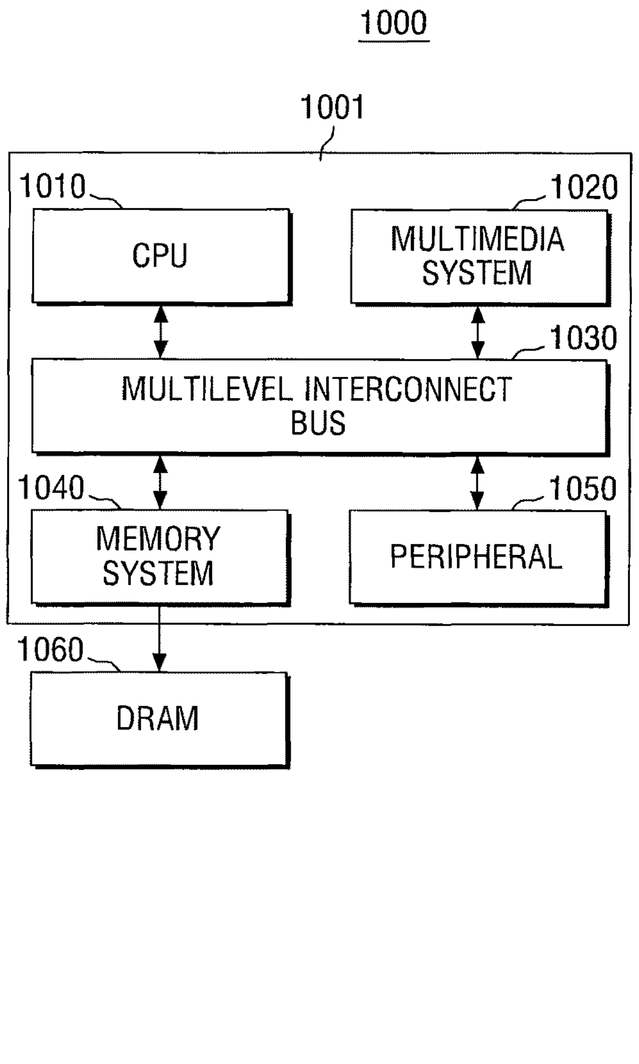
FIG. 24 is a block diagram of a SoC system comprising a semiconductor device according to exemplary embodiments.

FIG. 24 is a block diagram of a SoC system comprising a semiconductor device according to exemplary embodiments.

Referring to FIG. 24, the SoC system 1000 includes an application processor 1001 and a DRAM 1060.

The application processor 1001 may include a central processing unit (CPU) 1010, a multimedia system 1020, a bus 1030, a memory system 1040 and a peripheral circuit 1050.

The CPU 1010 may perform arithmetic operations to drive the SoC system 1000. In some exemplary embodiments, the CPU 1010 may be configured as a part of a multi-core environment which includes a plurality of cores.

The multimedia system 1020 may be used for performing a variety of multimedia functions on the SoC system 1000. Such multimedia system 1020 may include a three-dimensional (3D) engine module, a video codec, a display system, a camera system, a post-processor, and so on.

The bus 1030 may be used for exchanging data communication among the CPU 1010, the multimedia system 1020, the memory system 1040 and the peripheral circuit 1050. In some exemplary embodiments, the bus 1030 may have a multi-layer structure. Specifically, an example of the bus 1030 may be a multi-layer advanced high-performance bus (AHB), or a multi-layer advanced extensible interface (AXI), although other implementations may be used.

The memory system 1040 may provide an environment for the application processor 1001 to connect to an external memory (e.g., DRAM 1060) and perform high-speed operation. In some exemplary embodiments, the memory system 1040 may include a separate controller (e.g., DRAM controller) to control an external memory (e.g., DRAM 1060).

The peripheral circuit 1050 may provide an environment for the SoC system 1000 to have a seamless connection to an external device (e.g., main board). Accordingly, the peripheral circuit 1050 may include a variety of interfaces to allow compatible operation with the external device connected to the SoC system 1000.

The DRAM 1060 may function as an operational memory for the operation of the application processor 1001. In some exemplary embodiments, the DRAM 1060 may be external to the application processor 1001, as illustrated. Specifically, the DRAM 1060 may be a package on package (POP) type with the application processor 1001.

At least one of the above-mentioned components of the SoC system 1000 may include at least one of the semiconductor devices according to the exemplary embodiments explained above.

In concluding the detailed description, those skilled in the art will appreciate that many variations and modifications can be made to the preferred embodiments without substantially departing from the principles of the present inventive concept. Therefore, the disclosed preferred embodiments of the invention are used in a generic and descriptive sense only and not for purposes of limitation.

What is claimed:

1. A semiconductor device comprising:

a substrate;

a first fin-type pattern disposed on the substrate, and including a first lower portion and a first protruding portion on the first lower portion;

a second fin-type pattern disposed on the substrate, and including a second lower portion and a second protruding portion on the second lower portion;

a third fin-type pattern disposed on the substrate, wherein the second fin-type pattern is disposed in a space between the first fin-type pattern and the third fin-type pattern, wherein the first fin-type pattern and the second fin-type pattern are spaced apart from each other at a first distance in a first horizontal direction parallel to an upper surface of the substrate, wherein the first fin-type pattern and the third fin-type pattern are spaced apart from each other at a second distance in the first horizontal direction, and wherein the second distance is different from the first distance; and a field insulating film disposed on the substrate and disposed between the first lower portion of the first fin-type pattern and the second lower portion of the second fin-type pattern, wherein the first protruding portion of the first fin-type pattern protrudes beyond an upper surface of the field insulating film, wherein the first protruding portion includes a first point, a second point at which the first protruding portion has a first width, and a third point at which the first protruding portion has a second width less than the first width of the first protruding portion, wherein the second point of the first protruding portion is higher than the third point of the first protruding portion, and the first point of the first protruding portion is higher than the second point of the first protruding portion, wherein a maximum width of the first protruding portion is a width at a first boundary between the first protruding portion and the first lower portion, wherein a first portion, between the second point and an uppermost end of the first protruding portion, of the first protruding portion is a decreasing width in a vertical direction along which a distance from the upper surface of the substrate increases, wherein a second portion, between the third point and the second point, of the first protruding portion is an increasing width in the vertical direction, wherein a third portion, between the first boundary and the third point, of the first protruding portion has a decreasing width in the vertical direction, wherein the second point of the first protruding portion is at a boundary between the first and second portions of the first protruding portion, and the third point of the first protruding portion is at a boundary between the second and third portions of the first protruding portion, wherein the second protruding portion of the second fin-type pattern protrudes beyond the upper surface of the field insulating film, wherein the second protruding portion includes a first point, a second point at which the second protruding portion has a third width, and a third point at which the second protruding portion has a fourth width less than the third width of the second protruding portion, wherein the second point of the second protruding portion is higher than the third point of the second protruding portion, and the first point of the second protruding portion is higher than the second point of the second protruding portion, wherein a maximum width of the second protruding portion is a width at a second boundary between the second protruding portion and the second lower portion, wherein a first portion, between the second point and an uppermost end of the second protruding portion, of the second protruding portion is a decreasing width in the vertical direction, wherein a second portion, between the third point and the second point, of the second protruding portion is an increasing width in the vertical direction, wherein a third portion, between the second boundary and the third point, of the second protruding portion has a decreasing width in the vertical direction, wherein the second point of the second protruding portion is at a boundary between the first and second portions of the second protruding portion, and the third point of the second protruding portion is at a boundary between the second and third portions of the second protruding portion, wherein a maximum width of the first lower portion of the first fin-type pattern is greater than the maximum width of the first protruding portion at the first boundary, wherein the first lower portion has a decreasing width in the vertical direction, wherein a maximum width of the second lower portion of the second fin-type pattern is greater than the maximum width of the second protruding portion at the second boundary, wherein the second lower portion has a decreasing width in the vertical direction, wherein the first protruding portion of the first fin-type pattern is asymmetric with respect to a central vertical line of the first fin-type pattern, and wherein the second protruding portion of the second fin-type pattern is symmetric with respect to a central vertical line of the second fin-type pattern.

2. The semiconductor device of claim 1, wherein a material of the first lower portion and the first protruding portion is formed of silicon (Si).

3. The semiconductor device of claim 2, wherein the first lower portion and the first protruding portion are formed of the same material.

4. The semiconductor device of claim 1, wherein a sidewall of the first protruding portion of the first fin-type pattern includes a concavely recessed portion.

5. The semiconductor device of claim 1, further comprising a first gate electrode disposed on the field insulating film and on the first fin-type pattern.

6. The semiconductor device of claim 5, wherein the first gate electrode includes a metal layer including a first metal portion disposed on the first fin-type pattern, a sidewall of the first metal portion includes a concavely recessed portion, and the metal layer includes TiN, WN, TiAl, TiAlN, TaN, TiC, TaC, TaCN, TaSiN, W, Al, Cu, Co, Ti, or Ta.

7. The semiconductor device of claim 1, wherein the upper surface of the field insulating film includes a first surface portion that contacts the first fin-type pattern, and a second surface portion that does not contact the first fin-type pattern and the second fin-type pattern, and at least a portion of the first surface portion of the upper surface of the field insulating film is disposed higher than the second surface portion of the upper surface of the field insulating film.

8. The semiconductor device of claim 1, wherein a material of the second lower portion and the second protruding portion is formed of SiGe.

9. The semiconductor device of claim 1, wherein the first protruding portion of the first fin-type pattern is asymmetric with respect to the central vertical line of the first fin-type pattern such that, beyond the upper surface of the field insulating film, a first sidewall has a slope that changes from acute to obtuse to acute relative to the first boundary, while an opposing second sidewall has only an acute or right-angle slope relative to the first boundary.

* * * * *